(12) United States Patent
Tischler

(10) Patent No.: US 8,896,010 B2
(45) Date of Patent: Nov. 25, 2014

(54) WAFER-LEVEL FLIP CHIP DEVICE PACKAGES AND RELATED METHODS

(71) Applicant: Michael A. Tischler, Vancouver (CA)

(72) Inventor: Michael A. Tischler, Vancouver (CA)

(73) Assignee: Cooledge Lighting Inc., Burnaby (CA)

( * ) Notice: Subject to any disclaimer, the term of this patent is extended or adjusted under 35 U.S.C. 154(b) by 0 days.

(21) Appl. No.: 13/949,546

(22) Filed: Jul. 24, 2013

(65) Prior Publication Data

US 2014/0175481 A1 Jun. 26, 2014

Related U.S. Application Data

(63) Continuation-in-part of application No. 13/748,864, filed on Jan. 24, 2013, now Pat. No. 8,759,125.

(60) Provisional application No. 61/790,441, filed on Mar. 15, 2013, provisional application No. 61/589,908, filed on Jan. 24, 2012, provisional application No. 61/589,909, filed on Jan. 24, 2012.

(51) Int. Cl.
| | |
|---|---|
| *H01L 33/00* | (2010.01) |
| *H01L 33/48* | (2010.01) |
| *H01L 23/00* | (2006.01) |
| *H05B 33/12* | (2006.01) |
| *H01L 33/50* | (2010.01) |
| *H01L 29/00* | (2006.01) |
| *H01L 27/14* | (2006.01) |
| *H05B 33/02* | (2006.01) |
| *H01L 25/075* | (2006.01) |
| *H01L 21/00* | (2006.01) |
| *H01L 25/00* | (2006.01) |

(52) U.S. Cl.
CPC ............. *H01L 33/50* (2013.01); *H01L 33/486* (2013.01); *H01L 2933/0041* (2013.01); *H01L 24/96* (2013.01); *H05B 33/12* (2013.01); *H01L 33/505* (2013.01); *H01L 25/0753* (2013.01); *H01L 2924/01005* (2013.01); *H01L 21/00* (2013.01); *H01L 29/00* (2013.01); *H01L 27/14* (2013.01); *H01L 2933/0033* (2013.01); *H05B 33/02* (2013.01); *H01L 25/00* (2013.01)
USPC .......................................................... 257/98

(58) Field of Classification Search
CPC ...... H01L 25/00; H01L 2933/00; H01L 33/00
USPC ................ 257/98, 89; 438/27, 29, 25, 28, 31; 313/503, 501, 512; 362/231, 97.3, 237, 362/606
See application file for complete search history.

(56) References Cited

U.S. PATENT DOCUMENTS

| | | | |
|---|---|---|---|
| 4,335,501 | A | 6/1982 | Wickenden et al. |
| 6,066,861 | A | 5/2000 | Hohn et al. |

(Continued)

FOREIGN PATENT DOCUMENTS

| | | |
|---|---|---|
| CN | 2788361 Y | 6/2006 |
| EP | 1326289 A2 | 7/2003 |

(Continued)

OTHER PUBLICATIONS

International Search Report mailed Jul. 4, 2013 for International Application No. PCT/US2013/022468 (9 pages).

(Continued)

*Primary Examiner* — Telly Green
(74) *Attorney, Agent, or Firm* — Bingham McCutchen LLP

(57) ABSTRACT

In accordance with certain embodiments, semiconductor dies are at least partially coated with a polymer and a conductive adhesive prior being bonded to a substrate having electrical traces thereon.

24 Claims, 20 Drawing Sheets

(56) References Cited

U.S. PATENT DOCUMENTS

| | | | |
|---|---|---|---|
| 6,087,680 A | 7/2000 | Gramann et al. |
| 6,274,399 B1 | 8/2001 | Kern et al. |
| 6,498,051 B1 | 12/2002 | Watanabe |
| 6,635,987 B1 | 10/2003 | Wojnarowski et al. |
| 6,649,440 B1 | 11/2003 | Krames et al. |
| 6,733,711 B2 | 5/2004 | Durocher et al. |
| 6,751,898 B2 | 6/2004 | Heropoulos et al. |
| 6,949,772 B2 | 9/2005 | Shimizu et al. |
| 7,083,993 B2 | 8/2006 | Erchak et al. |
| 7,084,434 B2 | 8/2006 | Erchak et al. |
| 7,163,327 B2 | 1/2007 | Henson et al. |
| 7,166,870 B2 | 1/2007 | Erchak et al. |
| 7,208,769 B2 | 4/2007 | Guenther et al. |
| 7,225,538 B2 | 6/2007 | Eldridge et al. |
| 7,235,817 B2 | 6/2007 | Yano et al. |
| 7,250,611 B2 | 7/2007 | Aguirre et al. |
| 7,252,408 B2 | 8/2007 | Mazzochette et al. |
| 7,256,483 B2 | 8/2007 | Epler et al. |
| 7,322,718 B2 | 1/2008 | Setomoto et al. |
| 7,329,887 B2 | 2/2008 | Henson et al. |
| 7,344,296 B2 | 3/2008 | Matsui et al. |
| 7,344,902 B2 | 3/2008 | Basin et al. |
| 7,352,011 B2 | 4/2008 | Smits et al. |
| 7,375,381 B2 | 5/2008 | Shimizu et al. |
| 7,397,177 B2 | 7/2008 | Takahashi et al. |
| 7,400,439 B2 | 7/2008 | Holman |
| 7,456,805 B2 | 11/2008 | Ouderkirk et al. |
| 7,488,621 B2 | 2/2009 | Epler et al. |
| 7,524,206 B2 | 4/2009 | Gutierrez et al. |
| 7,658,526 B2 | 2/2010 | Henson et al. |
| 7,666,715 B2 | 2/2010 | Brunner et al. |
| 7,710,045 B2 | 5/2010 | Schultz et al. |
| 7,766,518 B2 | 8/2010 | Piepgras et al. |
| 7,868,341 B2 | 1/2011 | Diana et al. |
| 7,952,107 B2 | 5/2011 | Daniels et al. |
| 7,967,652 B2 | 6/2011 | Emerson |
| 7,972,875 B2 | 7/2011 | Rogers et al. |
| 7,994,529 B2 | 8/2011 | Bierhuizen et al. |
| 8,004,172 B2 | 8/2011 | Hussell et al. |
| 8,035,125 B2 | 10/2011 | Abe |
| 8,049,236 B2 | 11/2011 | Shi et al. |
| 8,058,088 B2 | 11/2011 | Cannon et al. |
| 8,058,659 B2 | 11/2011 | Bisberg |
| 8,064,743 B2 | 11/2011 | Meir et al. |
| 8,067,884 B2 | 11/2011 | Li |
| 8,072,134 B2 | 12/2011 | Erchak et al. |
| 8,076,680 B2 | 12/2011 | Lee et al. |
| 8,089,089 B2 | 1/2012 | Kuo et al. |
| 8,100,552 B2 | 1/2012 | Spero |
| 8,115,217 B2 | 2/2012 | Duong et al. |
| 8,128,272 B2 | 3/2012 | Fine et al. |
| 8,395,568 B2 | 3/2013 | Ray et al. |
| 2004/0070014 A1 | 4/2004 | Lin et al. |
| 2004/0105264 A1 | 6/2004 | Spero |
| 2005/0022697 A1 | 2/2005 | Benrashid et al. |
| 2005/0051782 A1 | 3/2005 | Negley et al. |
| 2005/0269582 A1 | 12/2005 | Mueller et al. |
| 2006/0124955 A1 | 6/2006 | Sakakibara |
| 2006/0186425 A1 | 8/2006 | Yano et al. |
| 2007/0013057 A1 | 1/2007 | Mazzochette |
| 2007/0023769 A1 | 2/2007 | Nishimoto et al. |
| 2008/0023687 A1 | 1/2008 | Choi et al. |
| 2008/0121911 A1 | 5/2008 | Andrews et al. |
| 2008/0137106 A1 | 6/2008 | Ono |
| 2008/0144333 A1 | 6/2008 | Gourlay |
| 2008/0179611 A1 | 7/2008 | Chitnis et al. |
| 2008/0217601 A1 | 9/2008 | Erchak et al. |
| 2008/0225549 A1 | 9/2008 | Dassanayake et al. |
| 2009/0085464 A1 | 4/2009 | Oguma et al. |
| 2009/0095963 A1 | 4/2009 | Daniels |
| 2009/0121250 A1 | 5/2009 | DenBaars et al. |
| 2009/0129115 A1 | 5/2009 | Fine et al. |
| 2009/0140272 A1 | 6/2009 | Beeson et al. |
| 2009/0160043 A1 | 6/2009 | Shen et al. |
| 2009/0179213 A1 | 7/2009 | Cannon et al. |
| 2009/0194776 A1 | 8/2009 | Pachler |
| 2009/0242921 A1 | 10/2009 | Aliyev |
| 2010/0025700 A1 | 2/2010 | Jung et al. |
| 2010/0032697 A1 | 2/2010 | Nagai |
| 2010/0096977 A1 | 4/2010 | Lee et al. |
| 2010/0109023 A1 | 5/2010 | Yonehara |
| 2010/0109025 A1 | 5/2010 | Bhat |
| 2010/0127290 A1 | 5/2010 | Joo et al. |
| 2010/0140655 A1 | 6/2010 | Shi |
| 2010/0155763 A1 | 6/2010 | Donofrio et al. |
| 2010/0171215 A1 | 7/2010 | Fischer et al. |
| 2010/0186883 A1 | 7/2010 | Tomoda |
| 2010/0213485 A1 | 8/2010 | McKenzie et al. |
| 2010/0271819 A1 | 10/2010 | Kristoffersen et al. |
| 2010/0283062 A1 | 11/2010 | Hsieh et al. |
| 2010/0308354 A1 | 12/2010 | David et al. |
| 2010/0315817 A1 | 12/2010 | Zimmermann |
| 2010/0315833 A1 | 12/2010 | Holman et al. |
| 2010/0317132 A1 | 12/2010 | Rogers et al. |
| 2010/0320904 A1 | 12/2010 | Meir |
| 2011/0006316 A1 | 1/2011 | Ing et al. |
| 2011/0018014 A1 | 1/2011 | Aanegola et al. |
| 2011/0025951 A1 | 2/2011 | Jones |
| 2011/0085112 A1 | 4/2011 | Inditsky |
| 2011/0090696 A1 | 4/2011 | Nagai et al. |
| 2011/0108874 A1 | 5/2011 | Chu et al. |
| 2011/0136271 A1 | 6/2011 | von Malm |
| 2011/0163681 A1 | 7/2011 | Dau et al. |
| 2011/0170289 A1 | 7/2011 | Allen et al. |
| 2011/0186900 A1 | 8/2011 | Watari et al. |
| 2011/0195532 A1 | 8/2011 | Lerman et al. |
| 2011/0198632 A1 | 8/2011 | Lerman et al. |
| 2011/0204790 A1 | 8/2011 | Arik et al. |
| 2011/0215701 A1 | 9/2011 | Tong et al. |
| 2011/0220920 A1 | 9/2011 | Collins et al. |
| 2011/0254042 A1 | 10/2011 | Shaikevitch |
| 2011/0256647 A1 | 10/2011 | Shaikevitch |
| 2011/0284822 A1 | 11/2011 | Jung et al. |
| 2011/0315956 A1 | 12/2011 | Tischler et al. |
| 2012/0002420 A1 | 1/2012 | Imai et al. |

FOREIGN PATENT DOCUMENTS

| | | | |
|---|---|---|---|
| EP | 1418628 A1 | 5/2004 |
| EP | 1693904 A2 | 8/2006 |
| EP | EU-2117054 A2 | 11/2009 |
| EP | 2369642 A1 | 9/2011 |
| EP | 2393127 A1 | 12/2011 |
| EP | EU-2410357 A2 | 1/2012 |
| EP | EU-2423717 A2 | 2/2012 |
| GB | 2447091 A | 9/2008 |
| IL | 34547 A | 5/1983 |
| JP | 02292064 A | 12/1990 |
| JP | 4028269 A | 1/1992 |
| JP | 08167687 A | 6/1996 |
| JP | 09219412 A | 8/1997 |
| JP | 10154784 A | 6/1998 |
| JP | 2000323756 A | 11/2000 |
| JP | 03277479 A | 10/2003 |
| JP | 2009051107 A | 3/2009 |
| KR | 20100091384 A | 8/2010 |
| KR | 20110127318 A | 11/2011 |
| WO | WO-03017353 A2 | 2/2003 |
| WO | WO-2004093131 A2 | 10/2004 |
| WO | WO-2005029599 A2 | 3/2005 |
| WO | WO-2006127785 A2 | 11/2006 |
| WO | WO-2007062169 A2 | 5/2007 |
| WO | WO-2007143365 A2 | 12/2007 |
| WO | WO-2007149362 A2 | 12/2007 |
| WO | WO-2008051596 A2 | 5/2008 |
| WO | WO-2008100991 A1 | 8/2008 |
| WO | WO-2009060227 A2 | 5/2009 |
| WO | WO-2009081090 A1 | 7/2009 |
| WO | WO-2010030430 A1 | 3/2010 |
| WO | WO-2010045915 A1 | 4/2010 |
| WO | WO-2011141779 A1 | 11/2011 |
| WO | WO-2011153298 A1 | 12/2011 |
| WO | WO-2011163556 A2 | 12/2011 |

(56) References Cited

FOREIGN PATENT DOCUMENTS

| WO | WO-2012000114 A1 | 1/2012 |
|----|------------------|--------|
| WO | WO-2013005940 A2 | 1/2013 |
| WO | WO-2013036561 A2 | 3/2013 |

OTHER PUBLICATIONS

International Search Report mailed Sep. 24, 2013 for International Application No. PCT/US2013/022899 (8 pages).

International Search Report mailed Jul. 11, 2013 for International Application No. PCT/US2013/037110 (5 pages).

International Search Report and Written Opinion mailed Jul. 30, 2014 for International Application No. PCT/IB2014/000716 (8 pages).

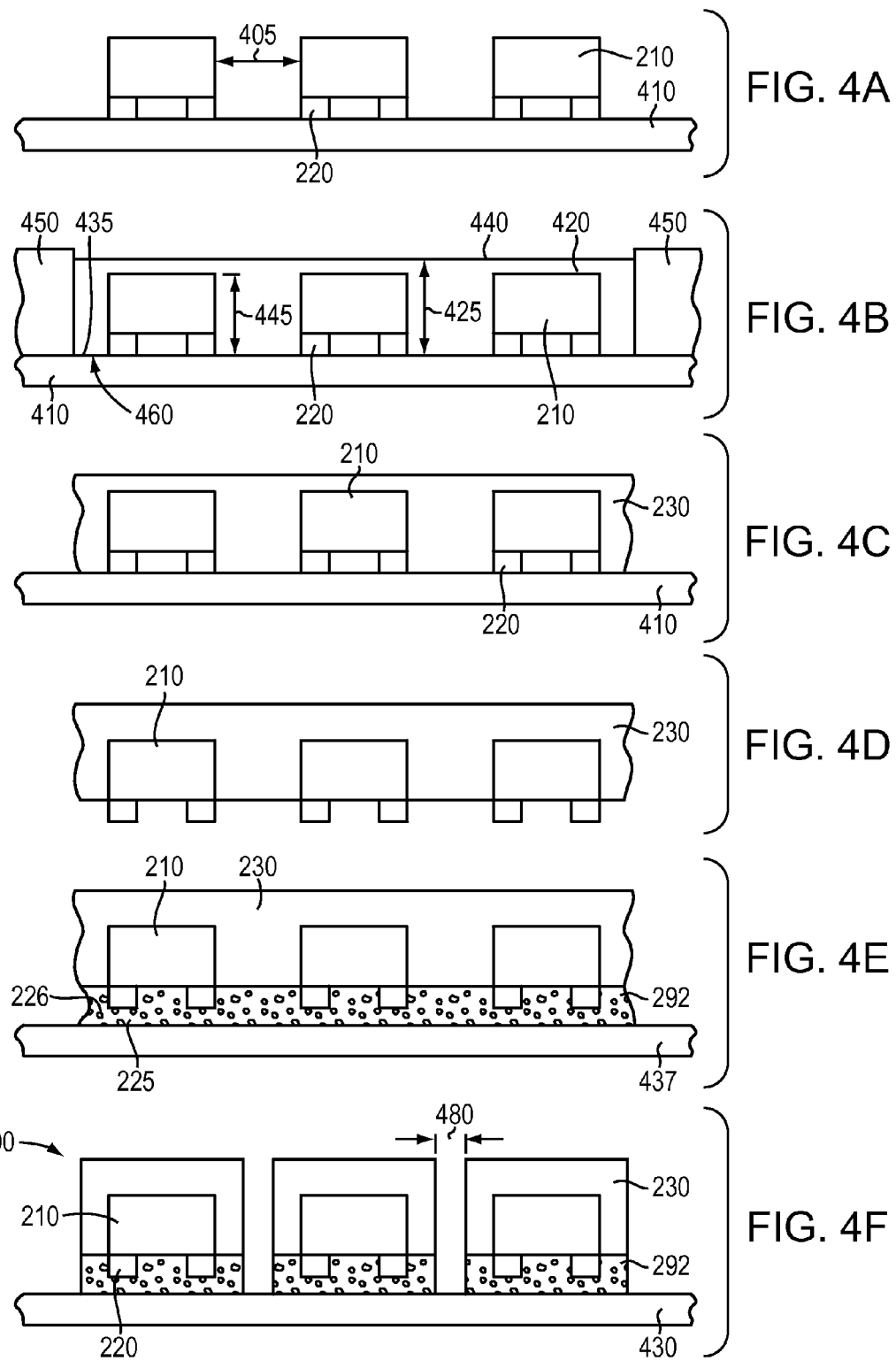

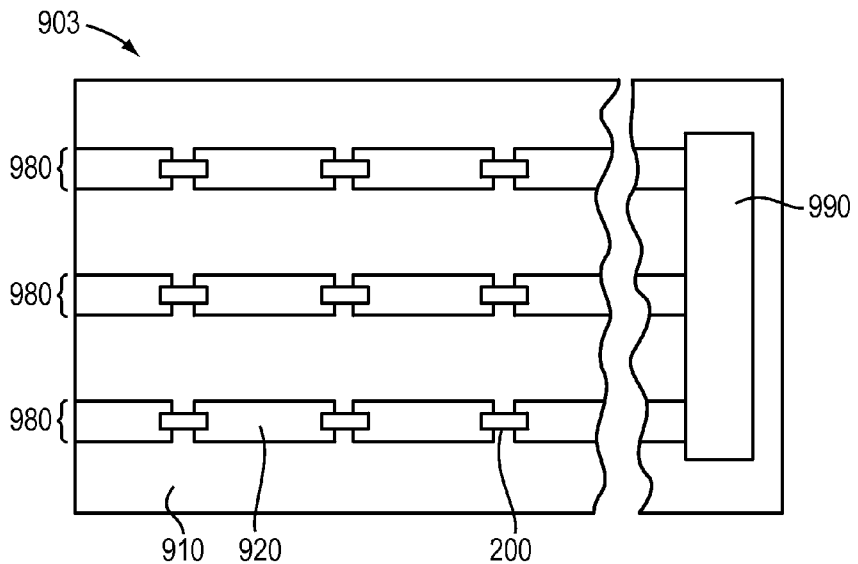
FIG. 9C
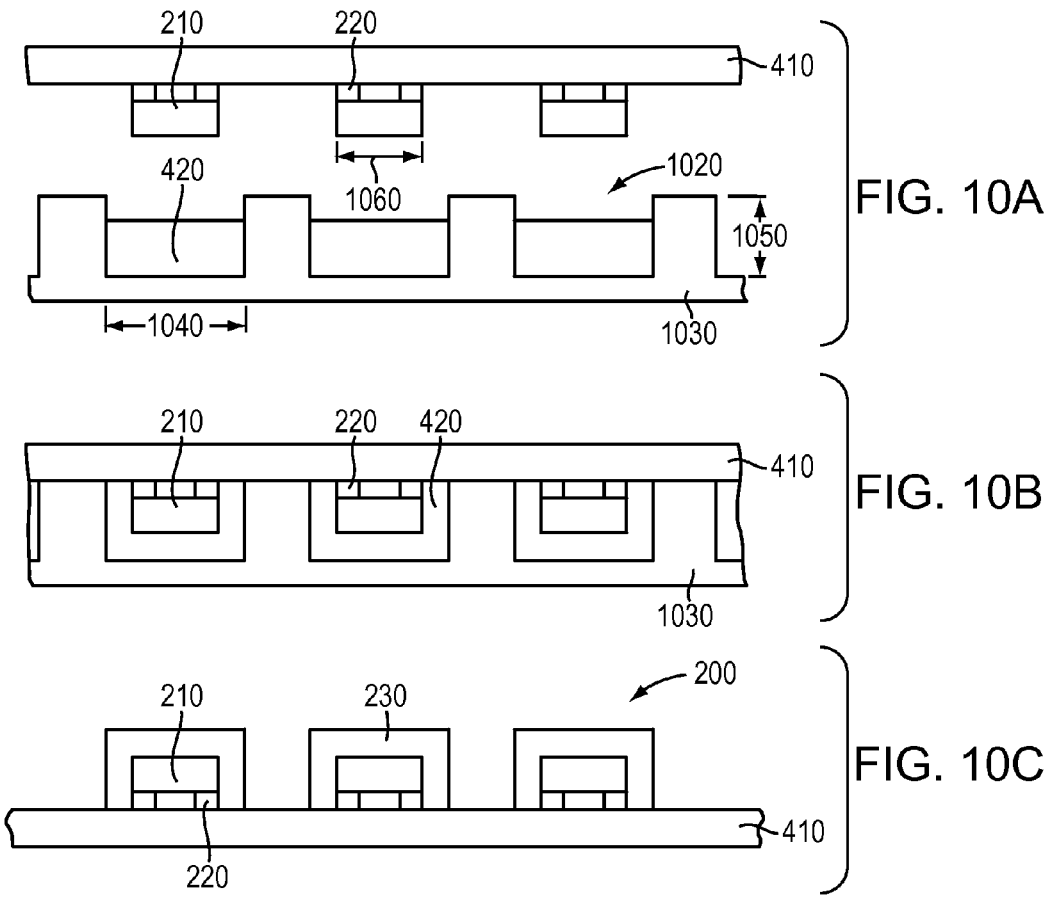
FIG. 10A
FIG. 10B
FIG. 10C

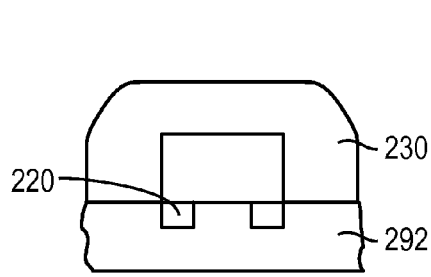
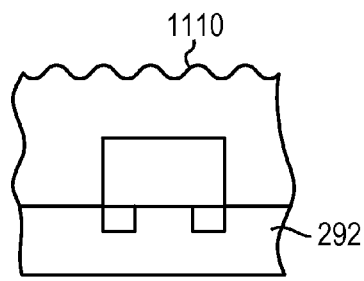
FIG. 11A          FIG. 11B
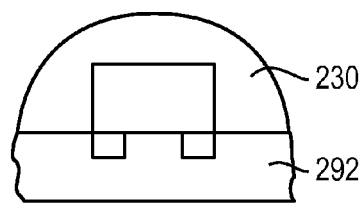
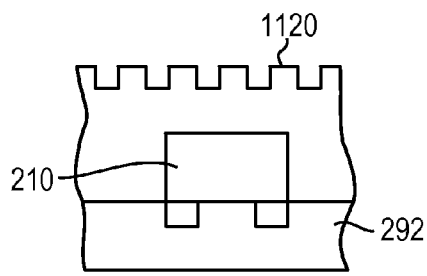
FIG. 11C          FIG. 11D
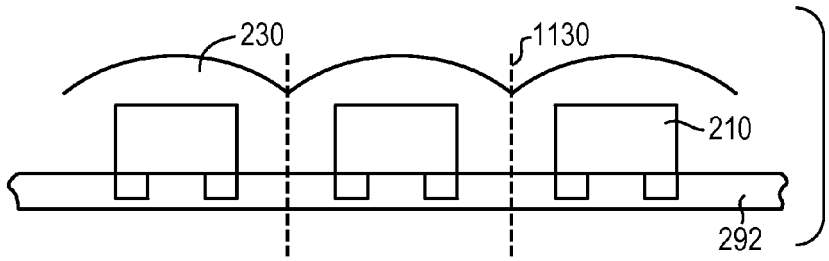
FIG. 11E
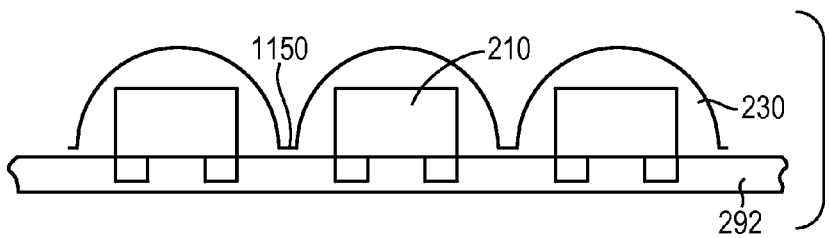
FIG. 11F
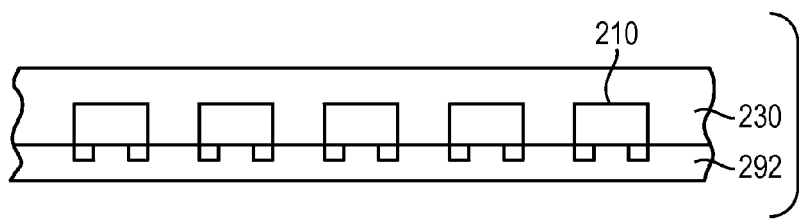
FIG. 12A

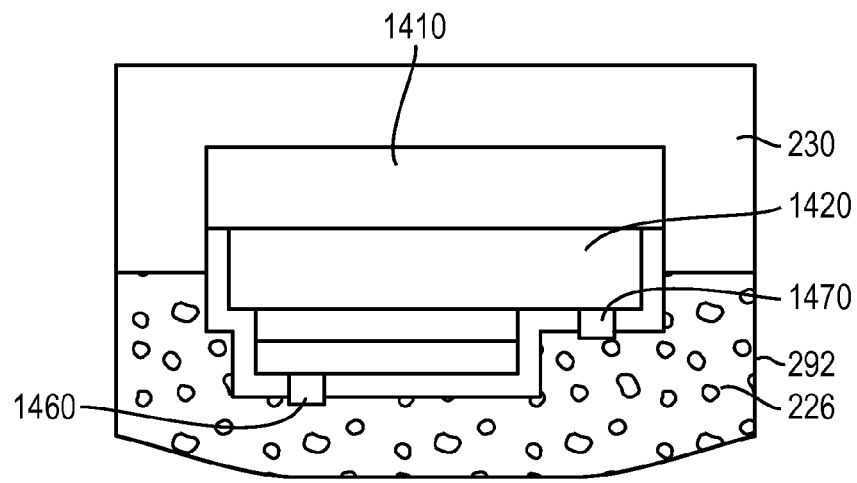
FIG. 15
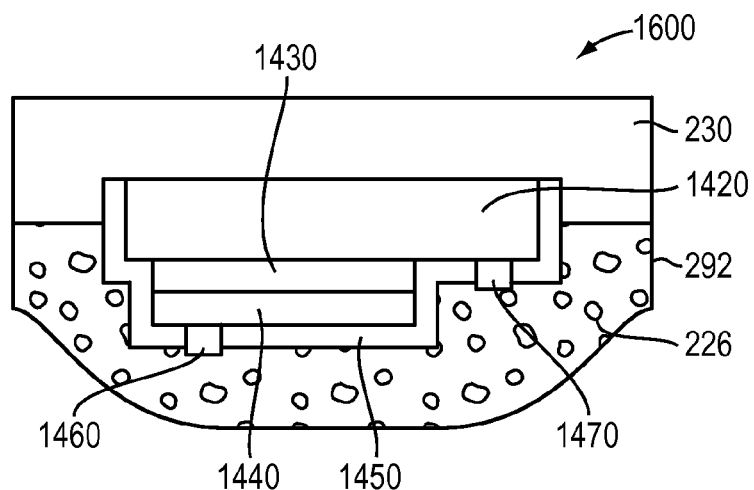
FIG. 16
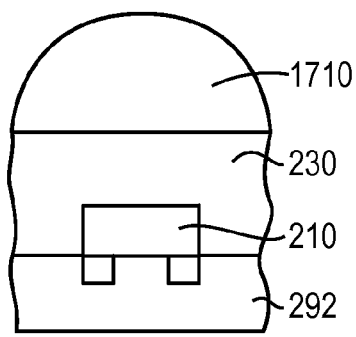 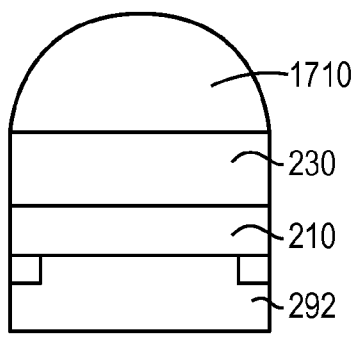 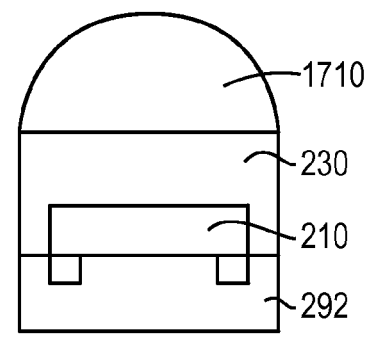
FIG. 17A          FIG. 17B          FIG. 17C

WAFER-LEVEL FLIP CHIP DEVICE PACKAGES AND RELATED METHODS

RELATED APPLICATIONS

This application claims the benefit of and priority to U.S. Provisional Patent Application No. 61/790,441, filed Mar. 15, 2013, and is a continuation-in-part of U.S. patent application Ser. No. 13/748,864, filed Jan. 24, 2013, which claims the benefit of and priority to U.S. Provisional Patent Application No. 61/589,908, filed Jan. 24, 2012, and U.S. Provisional Patent Application No. 61/589,909, filed Jan. 24, 2012, the entire disclosure of each of which is hereby incorporated herein by reference.

FIELD OF THE INVENTION

In various embodiments, the present invention relates to the fabrication of an encapsulated wafer-level flip chip package by use of encapsulation and a conductive adhesive.

BACKGROUND

Involved in all procedures of the production of final products from semiconductor devices, an electronic packaging technology is a system fabrication methodology covering a wide range of versatile techniques. With great advances in technology in recent years, semiconductor fabrication techniques have enabled the integration of one million or more cells, the multiplication of I/O pins, the enlargement of die sizes, the rapid radiation of large amounts of heat, and the high electrical performance of semiconductor devices. However, the progress of electronic packaging technology, which is utilized to encapsulate these semiconductor devices in some form of sealed package so as to protect them from external or internal damage, has consistently lagged behind the progress of semiconductor fabrication techniques.

In determining the performance, dimension, price and reliability of a final semiconductor device product, the electronic package technology is one of the most important factors. Chips 20 are typically fabricated on a wafer, for example wafer 10 shown in FIG. 1. The wafer is then singulated, i.e., separated into individual chips for subsequent packaging. Packaging generally includes putting the chip into a package as well as electrical connection of the chip I/O pins to the package contacts. A variety of packages and electrical connection methods have been developed. In one approach, wire bonding is used to connect the chip I/O pins to the package contacts. Wire bonding may be time consuming, and the wires may be relatively fragile and may require relatively large amounts of space within the package. A flip-chip approach may also be used. In the flip-chip process, a chip is fabricated with contacts on its top surface and then flipped for attachment of those contacts to a substrate (e.g., a circuit board). However, this has a drawback in that the production efficiency is poor in terms of process complexity and product cost because it typically requires conventional solder-using complex connection processes, that is, solder flux coating, chip/board arranging, solder bump reflowing, flux removing, underfill filling and curing processes. Moreover, flip-chip processes are generally performed on individually, pre-singulated devices, and thus uniformity and repeatability are often problematic.

In some applications, it is desirable to encapsulate the chip, for example to encapsulate a flip chip. This may be done for a variety of reasons, for example to protect the chip or to provide some enhanced functionality by virtue of the encapsulation. Such encapsulation is often performed on individually, pre-singulated devices, resulting in relatively high cost and, in the case where the encapsulation provides enhanced functionality, the uniformity and repeatability of this are often problematic. For example in the case of light-emitting devices, for example light-emitting diodes (LEDs), the encapsulant may provide enhanced functionality by including a light-conversion material that absorbs a portion of the light emitted by the LED and re-emits it at a different wavelength. Such a configuration may be used to produce light of different colors or different spectral power distributions. In one example, the LED emits light in the UV to blue wavelength range, and the combination of the LED and the light-conversion material produces substantially white light. Performing such encapsulation on an individual die basis (i.e., die-by-die) may result in variations in color (for example white point), resulting in low yield and increased cost.

In view of the foregoing, there is a need for a more uniform and less complex flip-chip-based packaging process for electronic devices fabricated on semiconductor substrates.

SUMMARY

Embodiments of the present invention provide techniques for fabricating a large-scale or wafer-level flip-chip package, which is advantageous in terms of production cost by simplifying the processes associated with the flip-chip die attachment process. Embodiments of the present invention simplify the processes necessary for encapsulation and connection of chips to a final substrate by, e.g., forming the encapsulation and enabling electrical connecting at the wafer level instead of at the individual die level.

In accordance with certain embodiments, semiconductor dies such as light-emitting elements (LEEs) are coated with a polymeric binder, which is subsequently cured to form a composite wafer of the solid binder material with the dies suspended therein. The contacts of each semiconductor die remain at least partially uncoated by the binder. An anisotropic conductive adhesive (ACA) may then be applied over the side of the solid binder material from which the uncoated contacts protrude. Techniques utilized in embodiments of the invention may include those disclosed in U.S. patent application Ser. Nos. 13/784,417 and 13/784,419, both filed on Mar. 4, 2013, the entire disclosures of which are incorporated by reference herein.

The composite wafer may be divided into free-standing "white dies" (or "coated dies") each containing a die, a portion of the cured binder that at least partially surrounds the die, and a portion of the ACA that covers the contacts and enables electrical connection thereto (through the ACA). The binder may advantageously contain a wavelength-conversion material such as a phosphor or a collection of quantum dots. Various mold substrates and/or molds may be utilized to secure the semiconductor dies and/or to prevent coating of the contacts of the dies during the coating process. In accordance with embodiments of the present invention, each white die may then be bonded to, e.g., heat-pressed against, a substrate so that the individual chips are electrically connected via the conductive particles of the ACA and physically bonded via the polymeric resin of the ACA to conductive traces on the substrate. In some embodiments, solder or stud bumps may be applied to the contacts before formation of the ACA over the contacts. In some embodiments, the bonding may be accomplished using energy sources other than heat to cure the ACA, for example UV radiation may be used. In one embodiment of the present invention, a yielding, i.e., flexible and/or deformable, substrate is used, which facilitates the connection between contacts on a chip and conductive traces formed over the yielding substrate without the use of solder or non-solder bumps, as detailed in U.S. patent application Ser. No. 13/171,973, filed on Jun. 29, 2011, the entire disclosure of which is incorporated by reference herein. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

A LEE may be of any size. In some embodiments, a LEEs has one lateral dimension less than 500 µm, while in other embodiments a LEE has one lateral dimension greater than 500 um. Exemplary sizes of a relatively small LEE may include about 175 µm by about 250 µm, about 250 µm by about 400 µm, about 250 µm by about 300 µm, or about 225 µm by about 175 µm. Exemplary sizes of a relatively large LEE may include about 1000 µm by about 1000 µm, about 500 µm by about 500 µm, about 250 µm by about 600 µm, or about 2000 µm by about 2000 µm. In some embodiments, a LEE includes or consists essentially of a small LED die, also referred to as a "microLED." A microLED generally has one lateral dimension less than about 300 µm. In some embodiments, the LEE has one lateral dimension less than about 200 µm or even less than about 100 µm. For example, a microLED may have a size of about 225 µm by about 175 µm or about 150 µm by about 100 µm or about 150 µm by about 50 µm. In some embodiments, the surface area of the top surface of a microLED is less than 50,000 µm$^2$ or less than 10,000 µm$^2$. The size of the LEE is not a limitation of the present invention, and in other embodiments the LEE may be relatively larger, e.g., the LEE may have one lateral dimension on the order of at least about 1000 µm or at least about 3000 µm.

As used herein, "phosphor" refers to any material that shifts the wavelengths of light irradiating it and/or that is fluorescent and/or phosphorescent. As used herein, a "phosphor" may refer to only the powder or particles (of one or more different types) or to the powder or particles with the binder, and in some circumstances may refer to region(s) containing only the binder (for example, in a remote-phosphor configuration in which the phosphor is spaced away from the LEE). The terms "wavelength-conversion material" and "light-conversion material" are utilized interchangeably with "phosphor" herein. The light-conversion material is incorporated to shift one or more wavelengths of at least a portion of the light emitted by LEEs to other (i.e., different) desired wavelengths (which are then emitted from the larger device alone or color-mixed with another portion of the original light emitted by the LEE). A light-conversion material may include or consist essentially of phosphor powders, quantum dots, organic dyes, or the like within a transparent binder. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The specific components and/or formulation of the phosphor and/or matrix material are not limitations of the present invention.

The binder may also be referred to as an encapsulant or a matrix material. In one embodiment, the binder includes or consists essentially of a transparent material, for example silicone-based materials or epoxy, having an index of refraction greater than 1.35. In one embodiment the binder and/or phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the Sylgard series manufactured by Dow Corning.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

Herein, a contact being "available for electrical connection" means the contact has sufficient free area to permit attachment to, e.g., a conductive trace, a circuit board, etc., and "free" means lacking any electrical connection (and in preferred embodiments, any mechanical connection) thereto.

In an aspect, embodiments of the invention feature an electronic device including or consisting essentially of a solid shaped volume of a polymeric binder, a bare-die light-emitting diode suspended within the binder, and an ACA. The bare-die light-emitting diode has a first face, a second face opposite the first face, and at least one sidewall spanning the first and second faces. At least two spaced-apart contacts are disposed on the first face of the bare-die light-emitting diode. The contacts each have a terminal end not covered by the binder. The ACA is disposed under at least a portion of the polymeric binder and in contact with the terminal ends of the contacts. At least a portion of the binder is transparent to a wavelength of light emitted by the light-emitting diode. The binder includes or consists essentially of silicone and/or epoxy with a wavelength-conversion material therein. At least a portion of the ACA opposite the contacts is available for electrical connection (i.e., available to make an electrical connection therethrough from the contacts of the light-emitting diode to another conductive layer or device (i.e., electrical traces) on the opposite side of the ACA).

Embodiments of the invention may include one or more of the following in any of a variety of combinations. At least portions of the contacts may protrude from the binder. Only a portion of each said sidewall (i.e., a portion but not all of each sidewall) may protrude from the binder. The wavelength-conversion material may include or consist essentially of a phosphor and/or quantum dots. The light-emitting diode may include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The wavelength-conversion material may absorb at least a portion of light emitted from the bare-die light-emitting diode and emit converted light having a different wavelength, converted light and unconverted light emitted by the bare-die light-emitting diode combining to form substantially white light. The substantially white light may have a correlated color temperature in the range of 2000 K to 10,000 K. A reflecting layer may be disposed between at least a portion of the binder and the ACA. The reflecting layer may include or consist essentially of a reflecting film and/or a plurality of reflective particles. At least a portion of a surface of the binder may have a texture having heights above the surface selected from the range of about 0.25 µm to about 15 µm. The texture may include or consist essentially of a substantially random surface roughness or a periodic or non-periodic array of features. The ACA may include or consist essentially of an anisotropic conductive film disposed on the binder and the contacts.

In another aspect, embodiments of the invention feature a method for forming a composite wafer including or consisting essentially of a plurality of discrete semiconductor dies suspended in a cured binder. The plurality of discrete semiconductor dies are disposed on a mold substrate. Each semiconductor die has at least two spaced-apart contacts disposed in contact with the mold substrate. The semiconductor dies are coated with a binder. The binder is cured to form the composite wafer, and the contacts of each semiconductor die remain at least partially uncoated by the binder. An ACA is applied over at least a portion of the composite wafer including at least a portion of binder and the at least partially uncoated contacts. At least a some of the semiconductor dies are bare-die light-emitting diodes. At least a portion of the binder is transparent to a wavelength of light emitted by the light-emitting diodes. The binder includes a wavelength-conversion material therein.

Embodiments of the invention may include one or more of the following in any of a variety of combinations. The ACA may include or consist essentially of an anisotropic conductive film. The ACA may be applied over substantially the entire composite wafer. The ACA may be applied over all of the contacts of the composite wafer but not over a portion of the binder. The composite wafer may be singulated, before or after the composite wafer is separated from the mold substrate, into a plurality of devices each including or consisting essentially of (i) at least one semiconductor die, (ii) at least a portion of the binder disposed around the at least one semiconductor die, and (iii) a portion of the ACA disposed in contact with contacts of the at least one semiconductor die. At least portions of the contacts may protrude from the binder after the semiconductor dies are coated with the binder. Only a portion (i.e., some but not all) of each said sidewall may protrude from the binder after the semiconductor dies are coated with the binder. The wavelength-conversion material may absorb at least a portion of light emitted from at least one the bare-die light-emitting diode and emit converted light having a different wavelength, converted light and unconverted light emitted by the at least one bare-die light-emitting diode combining to form substantially white light. The substantially white light may have a correlated color temperature in the range of 2000 K to 10,000 K. A reflecting layer may be formed between at least a portion of the binder and the ACA. The reflecting layer may include or consist essentially of a reflecting film and/or a plurality of particles (e.g., reflective particles). At least a portion of a surface of the binder may have a texture having heights above the surface selected from the range of about 0.25 µm to about 15 µm. The ACA may include or consist essentially of an anisotropic conductive film disposed on the binder and the contacts. The composite wafer may be removed from the mold substrate.

In yet another aspect, embodiments of the invention feature a method for forming a composite wafer including or consisting essentially of a plurality of discrete semiconductor dies suspended in a cured binder. The discrete semiconductor dies are disposed on a mold substrate. Each semiconductor die has at least two spaced-apart contacts, and at least some of the semiconductor dies are light-emitting diodes (e.g., bare-die light-emitting diodes). The semiconductor dies are coated with a binder, and the binder is cured to form the composite wafer. At least a portion of the binder proximate the contacts is removed to expose at least portions of the contacts. An ACA is applied over at least a portion of the binder and in contact with the contacts. The composite wafer is removed from the mold substrate.

Embodiments of the invention may include one or more of the following in any of a variety of combinations. The ACA may include or consist essentially of an anisotropic conductive film. The ACA may be applied over substantially the entire composite wafer. The ACA may be applied over all of the contacts of the composite wafer but not a portion of the binder.

In a further aspect, embodiments of the invention feature a composite wafer including or consisting essentially of a solid volume of a polymeric binder having a first surface and a second surface opposite the first surface, a plurality of semiconductor dies suspended within the binder, and an ACA. The semiconductor dies each have a first face, a second face opposite the first face, and at least one sidewall spanning the first and second faces. At least two spaced-apart contacts are disposed on the first face of each semiconductor die. Each contact has a terminal end protruding from the first surface and not covered by the binder. The ACA is disposed over and in contact with the terminal ends of the contacts. At least some of the semiconductor dies are bare-die light-emitting diodes. At least a portion of the binder is transparent to a wavelength of light emitted by the light-emitting diodes. The binder includes a wavelength-conversion material therein. At least a portion of the ACA opposite the contacts is available for electrical connection.

Embodiments of the invention may include one or more of the following in any of a variety of combinations. The ACA may be disposed over substantially the entire composite wafer. The ACA may be disposed over the terminal ends of all of the contacts but not a portion of the binder. The ACA may include or consist essentially of an anisotropic conductive film disposed on the binder and the contacts. At least portions of the contacts may protrude from the binder. Only a portion of each said sidewall may protrude from the binder. The wavelength-conversion material may include or consist essentially of a phosphor and/or quantum dots. At least one light-emitting diode may include or consist essentially of a semiconductor material including or consisting essentially of GaAs, AlAs, InAs, GaP, AlP, InP, ZnO, CdSe, CdTe, ZnTe, GaN, AlN, InN, silicon, and/or an alloy or mixture thereof. The wavelength-conversion material may absorb at least a portion of light emitted from at least one bare-die light-emitting diode and emit converted light having a different wavelength, converted light and unconverted light emitted by the at least one bare-die light-emitting diode combining to form substantially white light. The substantially white light may have a correlated color temperature in the range of 2000 K to 10,000 K. A reflecting layer may be disposed between at least a portion of the binder and the ACA. The reflecting layer may include or consist essentially of a reflecting film and/or a plurality of particles. At least a portion of a surface of the binder may have a texture having heights above the surface selected from the range of about 0.25 µm to about 15 µm.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The term "light" broadly connotes any wavelength or wavelength band in the electromagnetic spectrum, including, without limitation, visible light, ultraviolet radiation, and infrared radiation. Similarly, photometric terms such as "illuminance," "luminous flux," and "luminous intensity" extend to and include their radiometric equivalents, such as "irradiance," "radiant flux," and "radiant intensity." As used herein, the terms "substantially," "approximately," and "about" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 4A-4G are cross-sectional schematics of process steps utilized to fabricate coated dies in accordance with various embodiments of the invention;

FIG. 9C is a plan-view schematic of a lighting system utilizing coated dies in accordance with various embodiments of the invention;

FIGS. 10A-10D are cross-sectional schematics of process steps utilized to fabricate coated dies in accordance with various embodiments of the invention;

FIGS. 11A-11F and 12A are cross-sectional schematics of device structures in accordance with various embodiments of the invention;

FIGS. 15 and 16 are cross-sectional schematics of light-emitting structures in accordance with various embodiments of the invention;

FIGS. 17A-17C are cross-sectional schematics of coated dies incorporating optical elements in accordance with various embodiments of the invention;

DETAILED DESCRIPTION

Embodiments of the present invention provide a new approach to encapsulation and die attach of semiconductor chips (or "dies"). In particular, embodiments of the present invention provide a new approach to integration of phosphors and light-emitting elements (LEEs), such as LED dies, that addresses a number of the deficiencies and difficulties present in the current manufacture of packaged LEDs, for example packaged LEDs that emit white light (or "white LEDs"). Advantageously, the encapsulation (in the case of an LEE the encapsulant may include or consist essentially of phosphor and a binder) and means for electrical coupling of the contacts on the die to conductive traces on a mounting surface may be integrated with the die at the wafer level, before it is singulated and mounted, for example on a circuit board or substrate, or placed in a package. Alternatively, instead of being conventionally packaged, embodiments of the invention produce a package-free white die.

The encapsulation is generally performed in a batch process (i.e., for multiple dies, even an entire wafer of dies, concurrently), resulting in relatively low cost and improved uniformity and reproducibility. For example, the enablement of electrical coupling using an ACA may be performed in a batch process, resulting in relatively low cost and a simplified process.

Figure 1:
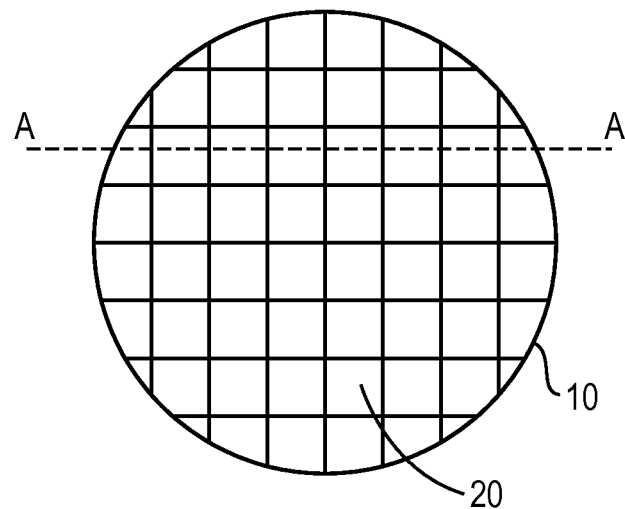
FIG. 1 is a plan-view schematic of a semiconductor wafer composed of unsingulated chips.
Figure 2A:
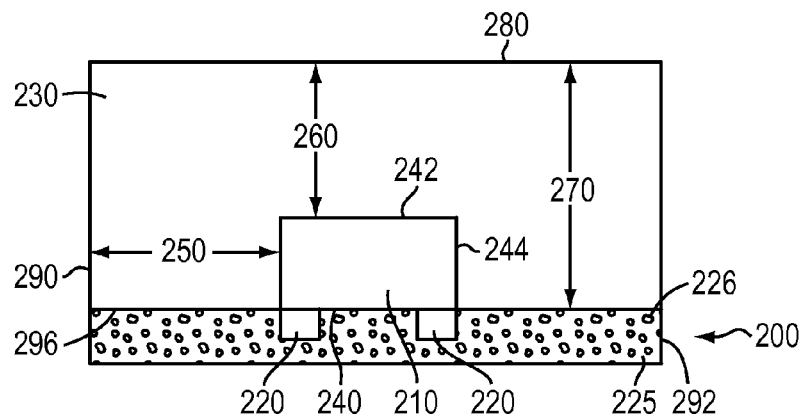
FIGS. 2A-2G are cross-sectional schematics of coated dies in accordance with various embodiments of the invention.
Figure 2B:
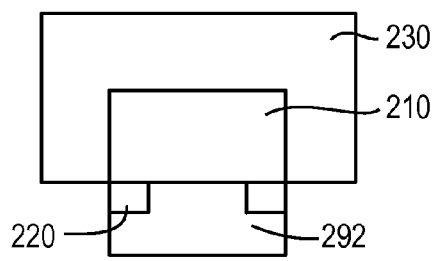

An example of an encapsulated structure is depicted as structure 200 in FIG. 2A. In one embodiment, structure 200 is a light-emitting structure and includes one or more LEEs 210, each of which features at least one contact 220. As shown, the LEE 210 is partially surrounded by a phosphor 230. At least a portion of one or more contacts 220 is not covered by phosphor 230. In the configuration shown in FIG. 2A, LEE 210 features two contacts 220 that are situated on the same face or side 240 of LEE 210 and are covered or partially covered with ACA 292. In some embodiments, ACA 292 may include or consist essentially of an epoxy or adhesive matrix component 225 and a plurality of conductive particles 226 within the matrix 225. As shown, at least a portion of the ACA 292 is not covered by phosphor 230 and is available for electrical connection. Herein, "available for electrical connection" means the contact or structure or material has sufficient free area to permit attachment to, e.g., a conductive trace, a circuit board, etc., and "free" means lacking any electrical connection (and in preferred embodiments, any mechanical connection) thereto. In one embodiment, ACA 292 covers all or substantially all of the bottom of structure 200, as shown for example in FIG. 2A. In one embodiment, ACA 292 covers only all or substantially all of the face of LEE 210 having contacts 220, as shown for example in FIG. 2B. In one embodiment, surface 240 of LEE 210 is coplanar or substantially coplanar with a surface 296 of phosphor 230, as shown, for example, in FIGS. 2A and 2B, while in other embodiments, surface 240 of LEE 210 is protrudes below surface 296 of phosphor 230, as shown for example in FIGS. 2C, 2E, and 2F. In some embodiments, surface 240 of LEE 210 is above surface 296 of phosphor 230, as shown for example in FIG. 2G. In some embodiments, all or portions of contacts 220 and/or all or portions of LEE 210 are embedded in a portion of ACA 292, as shown for example in FIGS. 2A, 2B, 2C, 2F, and 2G. In some embodiments, ACA 292 is overlaid on all or portions of contacts 220 and/or all or portions of LEE 210, as shown for example in FIGS. 2D and 2E. In some embodiments (not shown) only a portion of contacts 220 are embedded in a portion of ACA 292. The coverage of ACA 292 over LEE 210 and/or phosphor 230 are not limitations of the present invention. Whether all or a portion of contacts 220 and/or a portion of LEE 210 are embedded in ACA 292 is not a limitation of the present invention. Whether all or a portion of contacts 220 are recessed within or protrude from phosphor 230 is not a limitation of the present invention. However, in preferred embodiments of the invention, at least a portion of contacts 220 are contactable to ACA 292 for subsequent electrical connection therethrough.

Figure 2C:
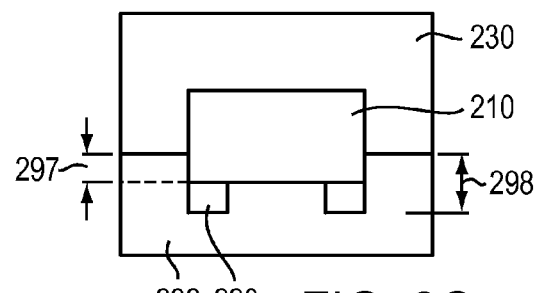
Figure 2D:
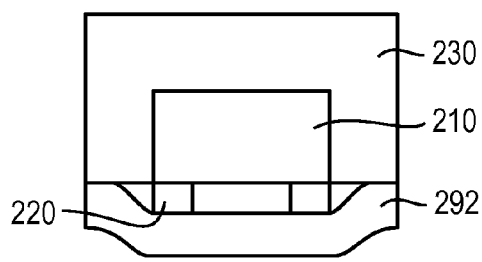
Figure 2E:
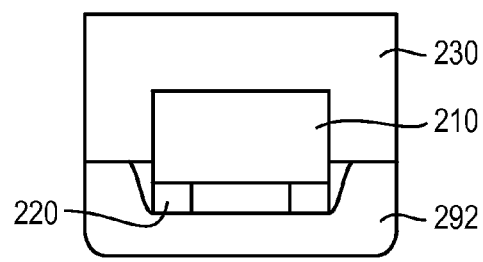
Figure 2F:
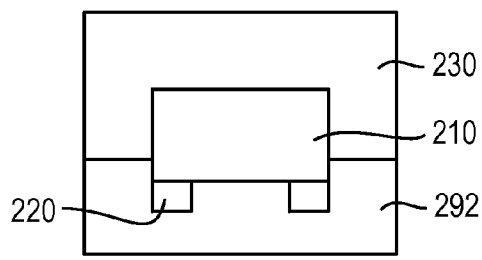
Figure 2G:
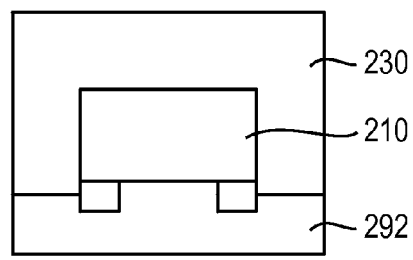

In some embodiments, a portion of the body of LEE 210 is not covered with phosphor, as shown in FIG. 2C. FIG. 2C shows a structure similar to that shown in FIG. 2A, but with a portion of the sidewall of the body of LEE 210 not covered in phosphor. The extent that LEE 210 extends beyond the edge of phosphor 230 may be identified as a "die relief" 297. In some embodiments, the die relief is positive, as shown in FIG. 2C, but in other embodiments the die relief may be substantially zero, as shown in FIG. 2A or even negative, as shown in FIG. 2G. Another dimension that may be advantageously controlled is a "contact relief" 298, as shown in FIG. 2C. The contact relief 298 is the amount that the contact protrudes from the adjacent surface of the phosphor. In some embodiments, the contact relief may be positive, while in other embodiments it may be substantially zero or negative. In some embodiments, the die relief may be in the range of 0 to about 30 µm. In some embodiments, the die relief may be substantially zero and the contact relief is positive. In some embodiments, both the die and contact relief are positive. In some embodiments, the contact relief is in the range of about 0 to about 30 µm. In some embodiments, the contact relief is positive and in the range of about 1 µm to about 8 µm. While the polarities and absolute values for the die and contact relief are not a limitation of the present invention, one aspect of preferred embodiments of the invention is that ACA 292 is contactable to contacts 220, as mentioned above. In some embodiments, this means that contacts 220 are in physical contact with ACA 292 before curing of ACA 292 (as will be described herein). In some embodiments, this means that contacts 220 are brought into contact with ACA 292 during processing, for example during the ACA cure process. In all aspects this means that contacts 220 are positioned such that after curing, they are able to make electrical contact through ACA 292 to an underlying substrate or carrier.

In some embodiments, phosphor 230 absorbs a portion of light emitted by LEE 210 and re-emits it at one or more different wavelengths, and the combination of light emitted by LEE 210 and phosphor 230 define one or more optical characteristics of structure 200, for example color temperature, color rendering index (CRI), or the like. In some embodiments, it is advantageous to control the die and contact relief such that multiple structures 200 have the same or substantially the same optical characteristics. If the die relief is relatively large, then a larger proportion of light emitted by LEE 210 may be observed directly, without passing through phosphor 230; thus, in some embodiments, a relatively small positive die relief is advantageous because it reduces the amount of light emitted directly from LEE 210 that does not pass through phosphor 230. In some embodiments, the contact relief is at least the height of contacts 220, that is, the distance that contacts 220 protrude from the surrounding surface of LEE 210. In some embodiments, the die relief may be in the range of about 0 to about 30 μm, while in other embodiments, the die relief may be in the range of about 0 to 10 μm. In some embodiments, the die relief is less than 20% of the height (i.e., the dimension perpendicular to the face of the die from which the contacts protrude) of LEE 210, while in other embodiments, the die relief is less than 10% or even less than 5% of the height of LEE 210. In some embodiments, the die relief is less than about 20% of the height of LEE 210, while in other embodiments, the die relief is less than about 10% or even less than about 5% or less than about 1% of the height of LEE 210. In some embodiments, it may be advantageous to reduce the variation in die relief within a wafer of coated dies (also referred to herein as a "white wafer" or "white die wafer") and/or between white wafers because it reduces the variation in one or more optical characteristics of the white dies. In some embodiments, the variation in die relief is less than about 25%, or less than about 10%, or less than about 5%, or even less than about 1%.

In some embodiments, the die relief and contact relief values are related. For example, in the embodiment shown in FIG. 2C, the contact relief is approximately determined by the sum of the die relief and the height of the contact, where the contact height is the amount that the contacts protrude from the surface of LEE 210. In some embodiments, the contact relief and/or die relief may be determined or optimized and controlled to minimize the amount of light emitted by LEE 210 that does not pass through phosphor 230 while providing sufficient contact and/or die relief to produce a reliable and robust electrical contact to LEE contacts 220 through ACA 292, as well as to produce a reliable and robust mechanical attachment of the structure 200, for example to an underlying substrate or circuit board.

While face 240 of LEE 210 is shown as being a single planar surface, this is not a limitation of the present invention, and in other embodiments, face 240 is composed of multiple non-coplanar surfaces or may have other configurations. In some embodiments, LEE 210 has more than two contacts 220. Structures 200 are shown in FIGS. 2A-2G as having no phosphor 230 covering face 240; however, this is not a limitation of the present invention, and in other embodiments phosphor 230 covers at least a portion of face 240. As discussed herein, phosphor may refer to a binder or matrix material alone or a mixture of the binder and wavelength-conversion material. In FIG. 2A, the width of phosphor 230 around the sides of LEE 210 is identified as a width 250, while the thickness of phosphor 230 over LEE 210 is identified as a thickness 260 and the thickness of phosphor 230 adjacent to LEE 210 is identified as a thickness 270. FIGS. 2A-2G show width 250, thickness 260, and thickness 270 as substantially constant; however, this is not a limitation of the present invention, and in other embodiments width 250, thickness 260, and/or thickness 270 may vary.

FIGS. 2A-2G show structures 200 each including one LEE 210; however, this is not a limitation of the present invention, and in other embodiments structure 200 includes more than one LEE 210. In some embodiments, multiple LEEs 210 of a single structure 200 are all the same, while in other embodiments a structure 200 includes at least two different types of LEEs 210. In one embodiment, different types of LEEs 210 emit light at different wavelengths. For example, structure 200 may include one or more of each of three different types of LEEs 210, where at least one type emits in the blue wavelength range, at least one emits in the green wavelength range, and at least one emits in the red wavelength range. In one embodiment, structure 200 may include one or more of each of two different types of LEEs 210, where at least one type emits in the blue wavelength range and at least one emits in the red wavelength range. The specific configuration of the LEEs 210 in structure 200 as well as their operating characteristics and properties are not limitations of the present invention. In one embodiment, different types of LEEs 210 have different light output powers. In one embodiment, phosphor 230 may be composed of multiple portions or volumes, where each portion or volume includes or consists essentially of one or more phosphors different from one or more phosphors in another portion. In one embodiment of this example, one or more portions include or consist essentially of only a transparent binder material, while one or more other portions include or consist essentially of a binder and one or more phosphors.

In some embodiments, a surface 280 of phosphor 230 is parallel or substantially parallel to a surface 242 of LEE 210. In some embodiments, a surface 290 of phosphor 230 is parallel or substantially parallel to a surface 244 of LEE 210. In some embodiments, phosphor 230 forms a substantially cubic or rectangular-solid shape (the contour of which may be broken by portions of the LEE 210 and/or the contacts of the LEE 210). The thickness 260 of phosphor 230 over LEE 210 is shown as the same or substantially the same over the entirety of LEE 210; however, this is not a limitation of the present invention, and in other embodiments thickness 260 of phosphor 230 over LEE 210 varies. The thickness 270 of phosphor 230 adjacent to LEE 210 is shown as the same or substantially the same for structure 200; however, this is not a limitation of the present invention, and in other embodiments thickness 270 of phosphor 230 adjacent to LEE 210 varies. FIGS. 2A and 2C show surface 280 and side surfaces 290 of phosphor 230 as flat or substantially flat; however, this is not a limitation of the present invention, and in other embodiments surface 280 and/or surface 290 are curved, roughened, patterned, or textured in a regular, periodic, or random pattern. In some embodiments, phosphor 230 has, at least in part, a smooth, substantially continuous shape. In some embodiments, shaping and/or patterning or texturing of the surface is achieved during the formation or molding process, while in other embodiments shaping and/or patterning or texturing is performed after the phosphor is molded or after it is cured or partially cured.

LEE 210 in FIG. 2A is shown as rectangular in cross-section, but this is not a limitation of the present invention, and in other embodiments LEE 210 is square, hexagonal, circular, triangular or any arbitrary shape and/or may have sidewalls forming any angle with respect to the surface 280 of white die 200. In FIG. 2A width 250 of phosphor 230 on the sides of LEE 210 is shown as the same or substantially the same on all sides of LEE 210; however, this is not a limitation of the present invention, and in other embodiments width 250 of phosphor 230 is different on one or more or all sides of LEE 210. FIG. 2A shows width 250 of phosphor 230 as the same or substantially the same across each side of LEE 210; however, this is not a limitation of the present invention, and in other embodiments width 250 of phosphor 230 varies along one or more sides of LEE 210.

Figure 3A:
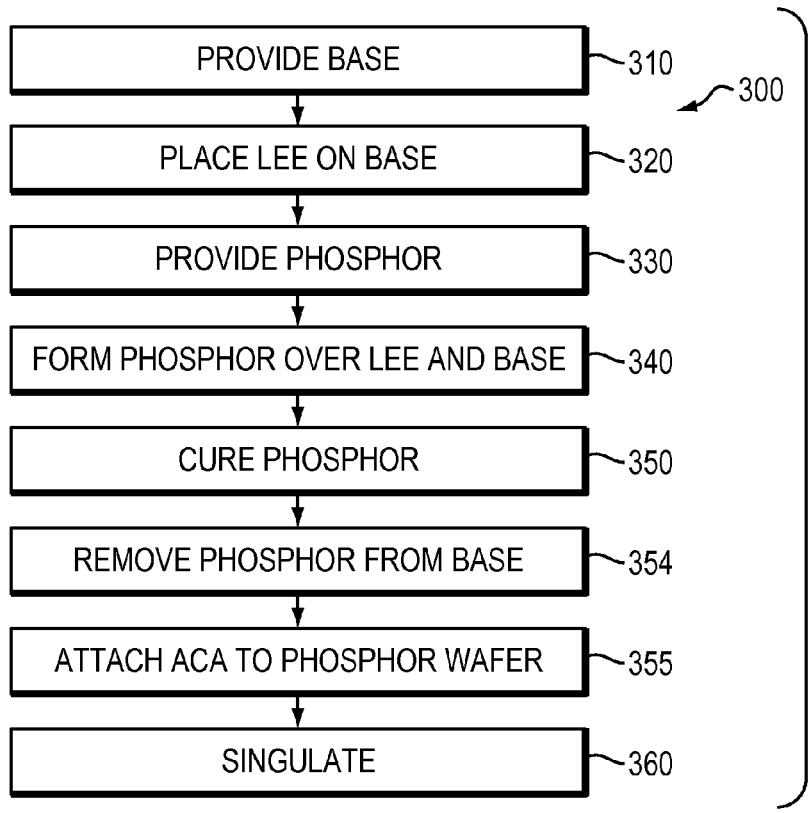
FIGS. 3A and 3B are flowcharts for techniques of fabricating structures in accordance with various embodiments of the invention.

As discussed above, embodiments of the present invention form phosphor 230 and ACA 292 on LEE 210, preferably at a wafer level, prior to attachment (electrical and/or mechanical) to a package or to a substrate. Structure 200 may then be integrated in a variety of packages, as discussed below. FIG. 3A shows a flow chart of a process 300 for forming the structure of FIG. 2C. Process 300 is shown having eight steps; however, this is not a limitation of the present invention, and in other embodiments the invention has more or fewer steps and/or the steps may be performed in different order. In step 310, a first surface or base is provided. In step 320, one or more LEEs are placed or formed on the base. In step 330, the phosphor is provided. In step 340, the phosphor is formed over the LEE and base. In step 350, the phosphor is cured. In step 354 the cured or partially cured phosphor wafer or white die wafer is removed from the base. In step 355, the ACA is formed over or attached to the cured phosphor on the side containing the exposed or partially exposed contacts. In step 360, the phosphor-coated structure is singulated into white dies.

Figure 3B:
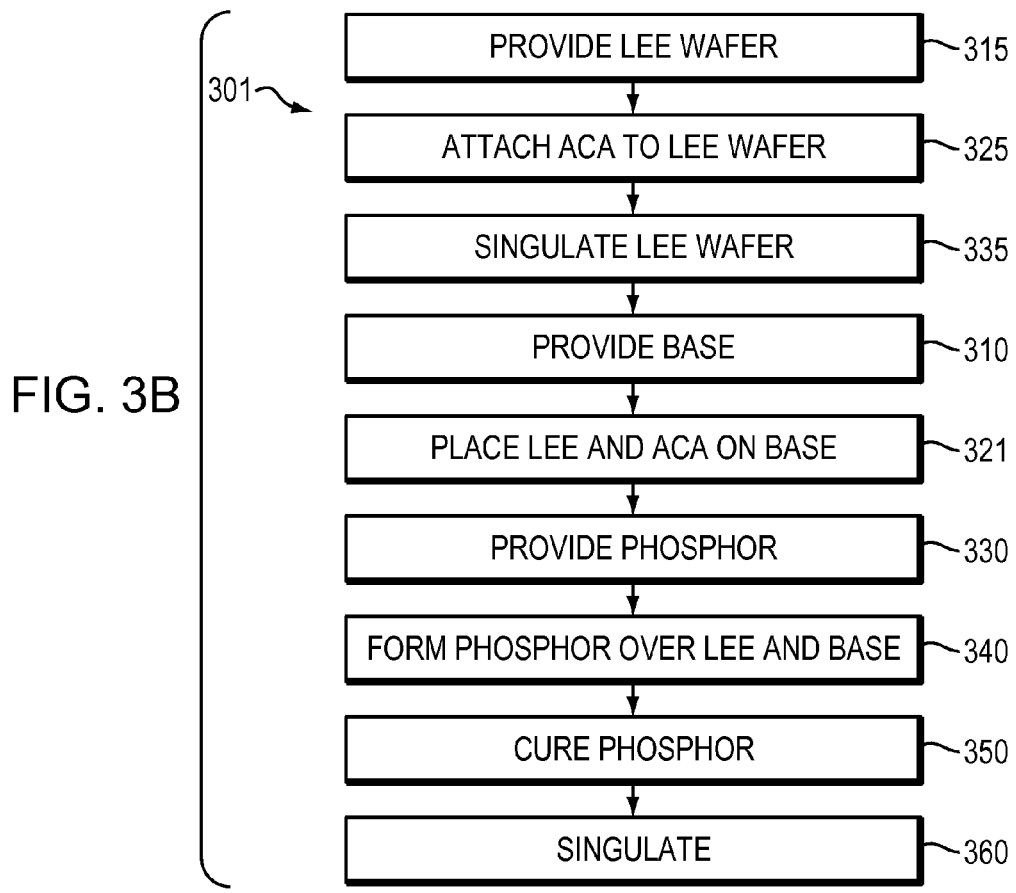

FIG. 3B shows a flow chart of a process 301 for forming the structure of FIG. 2B. Process 301 is shown having nine steps; however, this is not a limitation of the present invention, and in other embodiments the invention has more or fewer steps and/or the steps may be performed in different order. In step 315 a wafer or portion of a wafer of LEE dies is provided. This wafer is typically not singulated or partially singulated. In step 325, ACA is formed over or attached to the contact side of the wafer. In step 335, the wafer and ACA are singulated. In step 310, a first surface or base is provided. In step 321, one or more LEEs (along with the ACA) are placed or formed on the base. In step 330, the phosphor is provided. In step 340, the phosphor is formed over the LEE and base. In step 350, the phosphor is cured. In step 360, the structure is singulated into white dies.

As will be discussed herein, embodiments of the invention may be practiced with any type of device, die or chip, for example passive elements, active elements, integrated circuits, light-emitting elements such as LEDs and lasers, light-absorbing elements such as detectors or solar cells or combinations of any of these elements. The type, function or quantity of elements is not a limitation of the present invention.

Figure 4G:
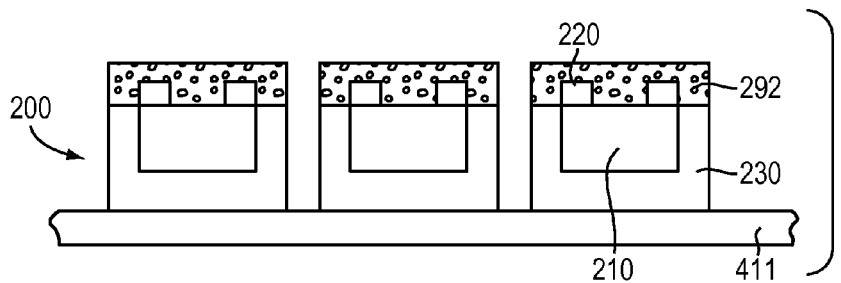

Various approaches to using white dies 200 are discussed herein. FIGS. 4A-4G depict one embodiment of process 300. In this embodiment, a base 410 is provided (step 310) and LEEs 210 are placed on or adhered to base 410 (step 320) with contacts 220 adjacent to base 410 (FIG. 4A). Base 410 may also be referred to as a "mold substrate." In one embodiment, base 410 includes or consists essentially of an adhesive film or tape. In some embodiments, base 410 includes or consists essentially of a material which has a relatively low adhesion to phosphor 230, that is, it permits removal of cured phosphor 230 from base 410. In some embodiments, base 410 is the same as or similar to dicing or transfer tapes used in the semiconductor industry for singulation and/or transfer of dies, for example Revalpha from Nitto Denko Corporation or tapes from Semiconductor Equipment Corporation. In some embodiments, base 410 includes or consists essentially of a water-soluble material or adhesive, or it may be covered or be partially covered with a water-soluble material. For example, the adhesive of base 410 or the liner or both may be water soluble. In some embodiments, the water-soluble material includes or consists essentially of a water-soluble tape, for example 3M type 5414.

In some embodiments, base 410 includes or consists essentially of a material with variable adhesive force. In such embodiments, the adhesive force may be altered after formation and curing of the phosphor to make it easier to remove the white die or white die wafer from base 410. (A white die wafer, also referred to as a composite wafer, is herein defined as a plurality of semiconductor dies suspended in a binder.) In one embodiment, such a variable adhesive force material may be a thermal release tape or a UV release tape. In one embodiment, the variable adhesive force material may be a water-soluble tape. In one embodiment, the variable adhesive force material may be an electrostatic chuck (LEEs 210 are formed or placed on the electrostatic chuck, similar to the structure shown in FIG. 4A). In this embodiment, LEEs 210 are held in place on the electrostatic chuck by electrostatic forces that may be activated or deactivated electrically.

In some embodiments, it is desirable for all or a portion of the face of contact 220 to be exposed after formation of white die 200, that is, to not be covered by phosphor 230. In some embodiments, placing or adhering all or a portion of the face of contact 220 adjacent to base 410 prevents coverage or formation of phosphor 230 over all or a portion of contact 220 or over all or a portion of the face of contact 220. In some embodiments, the thickness, hardness and/or other properties of a coating on base 410, or the properties of base 410, for example an adhesive thickness, chemical composition, surface energy, hardness, elasticity, etc., may be varied to ensure the desired level of exposure of contacts 220, for example by proximity to base 410 or partial or full embedding of contacts 220 into base 410.

In some embodiments, base 410 includes or consists essentially of a surface or a mold (e.g., a non-flat surface). In one embodiment, barriers 450 are formed by a recess in base 410. In FIG. 4B barriers 450 are shown as perpendicular or substantially perpendicular to a bottom surface 435; however, this is not a limitation of the present invention, and in other embodiments barriers 450 form any angle with surface 435. Base 410 may include or consist essentially of one or more of a variety of materials, for example glass, PET, PEN, plastic film, tape, adhesive on plastic film, metal, acrylic, polycarbonate, polymers, silicone, polytetrafluoroethylene (Teflon), or the like. In some embodiments, base 410 is rigid or substantially rigid, while in others base 410 is flexible. In some embodiments, it is advantageous for base 410 to include or consist essentially of a "non-stick" material such as Teflon, or a fluorinated material such as Fluon ETFE produced by Asahi Glass or to include a non-stick coating over the surface or portion of the surface that may come in contact with phosphor 230 (for example the binder in phosphor 230) so that phosphor 230 does not stick to base 410. In some embodiments, base 410 includes or consists essentially of a layer of material on surface 435 and/or barriers 450 that does not adhere well to the binder material. In some embodiments, base 410 includes or consists essentially of a water-soluble material or adhesive, or base 410 is partially or completely lined with a water-soluble material to aid in the release of base 410 from the material formed in base 410. In one embodiment, base 410 includes or consists essentially of or is partially or fully lined with a water-soluble tape, for example 3M type 5414. In some embodiments, base 410 is transparent to light, for example to visible or UV radiation. In some embodiments, the height of barrier 450 ranges from about 10 μm to about 1000 μm; however, the height of barrier 450 is not a limitation of the present invention, and in other embodiments barrier 450 has any height. In some embodiments, the area of base 410 is in the range of about 0.25 mm$^2$ to about 900 cm$^2$; however, the area of base 410 is not a limitation of the present invention, and in other embodiments the area of base 410 is smaller or larger. When barrier 450 is not a part of base 410, barrier 450 may include or consist essentially of a material similar to that or different from that of base 410. In some embodiments, barrier 450 may be a ring or stencil surrounding LEE 210.

A spacing 405 between adjacent LEEs 210, as shown in FIG. 4A, may be adjusted to control the width of phosphor 230 around the sides of LEEs 210. In one embodiment, spacing 405 between LEEs 210 is approximately determined by the sum of twice the desired sidewall thickness 250 of the phosphor and the kerf (where the kerf is the width of the region removed during the singulation process of white dies 200, for example identified as kerf 480 in FIG. 4F). In other embodiments, as discussed herein, the spacing 405 is independent of the amount of phosphor 230 surrounding LEEs 210. The thickness of phosphor 230 over the LEEs 210 may be controlled by controlling a thickness 425 of phosphor 420 that is formed or dispensed. In one embodiment, thickness 260 of phosphor 230 over LEE 210 is given approximately by the thickness 425 less the thickness 445.

In some embodiments, the spacing 405 between LEEs 210 is in the range of about 0.10 mm to about 5 mm, or preferably in the range of about 0.2 mm to about 1.5 mm. In some embodiments, it is advantageous, in order to reduce cost, to reduce the spacing 405 between LEEs 210. In some embodiments, reducing spacing 405 between LEEs 210 permits the manufacture of more LEEs 210 per unit area, thus reducing the manufacturing cost. In some embodiments, it is advantageous, in order to reduce cost, to reduce the amount of phosphor 230 formed around each LEE 210. In some embodiments, this reduces the volume and thus the cost of the binder associated with each LEE 210.

The next step (step 330) in process 300 provides a phosphor (uncured or partially cured phosphor 420). In one embodiment, phosphor 420 includes or consists essentially of a phosphor and a binder. In some embodiments, the phosphor and binder are mixed prior to application, for example in a centrifugal mixer, with or without a partial vacuum over the mixture.

In the next step (step 340) in process 300, phosphor 420 is formed over base 410 and LEEs 210 as shown in FIG. 4B. In some embodiments, phosphor 420 is contained or bounded by surface 435 of base 410 and optional sides or barriers 450 as shown in FIG. 4B. In this example, phosphor 420 has a bottom surface or face 460 and a top surface or face 440. In some embodiments, surfaces 460 and 440 are substantially parallel to each other. In some embodiments, surfaces 460 and 440 are substantially flat and parallel.

Phosphor 420 may be formed by a variety of techniques, for example casting, dispensing, pouring, injecting, injection, compression, transfer or other forms of molding, Mayer bar or draw-down bar, doctor blade, etc. The method of formation of phosphor 420 is not a limitation of the present invention. In some embodiments, base 410 is positioned such that surface 435 is level, such that when phosphor 420 is formed on base 410, surface 435, bottom surface 460 of phosphor 420 and top surface 440 of phosphor 420 are parallel or substantially parallel, forming a thin layer of phosphor 420 that has a uniform or substantially uniform thickness across all or most of the area of phosphor 420. In some embodiments, one or more barriers 450 are used to prevent or partially prevent the spread of phosphor 420. In some embodiments, surface 435 and barriers 450 form a mold for phosphor 420. In some embodiments, barriers 450 are portions of a separate component placed over base 410 surrounding LEEs 210. In some embodiments, barriers 450 are not used. Some embodiments of the present invention utilize a level base 410 and gravity to automatically produce phosphor layer 420 with a uniform or substantially uniform thickness. In one embodiment, the thickness uniformity of phosphor 420 is within about ±15%, within about ±10%, within about ±5%, or within about ±1% or less. In one embodiment, phosphor 420 has a thickness in the range of about 5 μm to about 2000 μm, while in other embodiments the phosphor has a thickness in the range of about 50 μm to about 500 μm. In some embodiments, phosphor 420 includes or consists essentially of a phosphor and a binder, and it may be desirable to adjust the concentration of the phosphor to permit the binder thickness to be relatively low, for example less than about 500 μm, or less than about 300 μm, or less than about 200 μm, in order to reduce the total volume of binder used and thus reduce the cost of the binder.

In one embodiment, the time between mixing phosphor 420 including or consisting essentially of binder and phosphor powder and forming phosphor 420 over base 410 is relatively short compared to the time required for settling of the powder in the binder, such that the phosphor and binder form a uniform and homogeneously distributed or substantially uniform and homogeneously distributed combination of phosphor powder in the binder. In one embodiment, the compositional uniformity of phosphor 420, that is the distribution of phosphor powder in the binder, is uniform to within about ±15%, within about ±10%, within about ±5% or within about ±1%. In some mixtures of phosphor and powder, settling starts to occur within about 10 to about 30 minutes, while formation of phosphor 420 in over base 410 occurs within about 0.25 minute to about 5 minutes. In some embodiments, the structure shown in FIG. 4B is exposed to a partial vacuum to degas, i.e., remove all or a portion of any dissolved gases in phosphor 420, to reduce or eliminate the number of bubbles in phosphor 420. In some embodiments, phosphor 420 is exposed to a partial vacuum before formation on base 410. In some embodiments, phosphor 420 is formed over base 410 in a partial vacuum. In some embodiments of the present invention, base 410 is not level, resulting in phosphor 420 having a non-uniform thickness over base 410 and LEE 210, as discussed herein in more detail.

Phosphor 420 is then cured, or partially cured producing cured phosphor 230 (step 350) as shown in FIG. 4C. Curing may include or consist essentially of heating, exposure to radiation of various sources, for example visible, UV and/or IR light, or chemical curing (i.e., introduction of a chemical agent that promotes cross-linking of the phosphor binder). In one embodiment, phosphor 420 is cured by UV or other radiation. In one embodiment, base 410 is held within the curing equipment prior to or just after step 350 of FIG. 3. In some mixtures of binder and powder, settling starts to occur within about 10 to about 30 minutes, while curing of phosphor 420 over base 410 occurs within about 0.10 minute to about 5 minutes. In one embodiment, steps 340 and 350 may take less than about 30 minutes, less than about 10 minutes, less than about 5 minutes, or less than about 1 minute. In some embodiments, the curing step 350 includes or consists essentially of multiple sub-curing steps. For example, a first sub-curing step may be performed to "freeze" the phosphor particles in the matrix, and this may be followed by a second sub-curing step to fully cure the binder. In some embodiments, both the formation and curing process may occur within about 0.25 minute to about 7 minutes. In some embodiments, both the formation and curing process may take less than about 4 minutes.

In step 343 of process 300, the cured or partially cured phosphor wafer, also referred to as a white wafer, is removed from base 410, as shown in FIG. 4D. The structure in FIG. 4D includes phosphor 230 and LEEs 210, with at least a portion of some or all of contacts 220 not covered by phosphor 230. The details of any die and contact relief are not shown in FIGS. 4A-4G and FIG. 5, for clarity purposes.

In step 355 of process 300, ACA 292 is applied to the cured or partially cured structure of FIG. 4D. ACA 292 is applied to the side or portion of the structure including the exposed or partially exposed contacts 220 as shown in FIG. 4E. The structure shown in FIG. 4E (not including optional protective layer 437) may be referred to as an ACA white die wafer or ACA white wafer or ACA composite wafer. Conductive particles 226 may include or consist essentially of Au, Ni, or Niand Au-covered polymer particles, or Au, Ni, or Ni- and Au-covered polymer particles that are coated with an insulating layer. The specific configuration and materials of the ACA (which may also be in the form of a film when applied, i.e., an anisotropic conductive film (ACF)), and which may be pressure-activated, are not a limitation of the present invention. (As utilized herein, an ACF is a film having a predefined and substantially constant thickness when applied to contacts or other structures, rather than an adhesive in liquid and/or flowable form.) The application of ACA 292 to the white wafer may be achieved by dispensing, casting, spraying, use of a doctor blade, or a meniscus process using an ACA solution. Alternatively, an ACF may be employed, in which case the film may be adhered or laminated to the white wafer. The thickness of the ACF may be in the range of about 5 μm to about 50 μm or larger. In one embodiment, the ACA or ACF is heated and pressed against or laminated to the white wafer to attach ACA or ACF 292 to the white wafer. In some embodiments, a release film is applied over ACF or ACA 292 or over optional protective layer 437 prior to heating and pressing or lamination, to prevent adhesion of ACA or ACF 210 or optional protective layer 437 to the heating, pressing, or lamination apparatus. While subsequent references to ACF 292 will be referred to as ACA 292 herein for convenience, it should be understood that ACA 292 may include or consist essentially of an ACF unless otherwise indicated. In some embodiments, ACA 292 is attached to the phosphor wafer without or substantially without the formation of voids between the phosphor wafer and ACA 292; however, this is not a limitation of the present invention, and in other embodiments voids may be present between the phosphor wafer and ACA 292. In some embodiments, the heating and application of pressure are performed in a partial vacuum. In one embodiment, the ACA 292 is partially cured on the wafer during this process. In some embodiments, the ACA 202 resin is in a semi-cured state at this point in the process, for example about 50% cured or less. In some embodiments, phosphor 420 is partially cured, after which ACA 292 is applied, followed by one or more additional curing steps. In some embodiments, an optional protective layer 437 is formed over ACA layer 292 (on the side opposite LEEs 210) to protect ACA 292 during portions of the process. The optional protective layer is removed before attachment to the mounting substrate.

After formation of ACA 292, the structure shown in FIG. 4E is singulated, as shown in FIG. 4F. Separation, or singulation, of phosphor 230 to form structure 200 may be performed by a variety of techniques, for example laser cutting, cutting with a knife, die cutting, dicing, saw cutting, water jet cutting, ablation, or the like. In some embodiments, the ACA white wafer is mounted on a temporary substrate 430 for the singulation process, as shown in FIG. 4F. The method of singulation is not a limitation of the present invention. The singulation process results in separation into individual structures 200, where each structure 200 features at least one LEE 210, a portion of ACA 292 and a portion of phosphor 230, as shown in FIG. 2A. Singulation takes place between LEEs 210; thus, in some embodiments it is necessary to be able to align the singulation tool with the spaces, also called streets, between LEEs 210. In some embodiments, the ACA white wafer is mounted on a temporary substrate 430 with the contacts up, to permit relatively straightforward alignment of the singulation tool with LEE 210, to permit accurate singulation. In some embodiments, ACA 292 is transparent or partially transparent so that the positions of the singulation cuts are between LEEs 210. FIGS. 2A and 4F show one LEE 210 per singulation unit; however, this is not a limitation of the present invention, and in other embodiments one or more singulation units include multiple LEEs 210. In other embodiments, ACA 292 is opaque or translucent and alignment of the singulation tool with the streets may be accomplished by other techniques, for example using alignment marks, fiducials, etc. The method of alignment of the singulation tool to the streets is not a limitation of the present invention. Another aspect of this process is the adhesion of ACA 292 to phosphor 230 and LEE 210. ACA 292 generally has sufficient adhesion to phosphor 230 and LEE 210 such that singulation does not cause delamination or partial delamination of ACA 210 from phosphor 230 or LEE 210.

In some embodiments, the spacing between structures 200 after singulation is at least partially determined by the kerf of the singulation process. In some embodiments, it may be advantageous to increase the spacing between structures 200 for a subsequent step in the process, for example the pick-and-place operation to attach the structures 200 to a substrate. In some embodiments, increasing the spacing is accomplished by using a temporary substrate 430 that is expandable, for example an expandable dicing tape, for example Tape 18733 from Semiconductor Equipment Corporation, using a die expander tool, for example a model 1810 die matrix expander manufactured by Semiconductor Equipment Corporation. The expandable tape is stretched, for example using a die matrix expander tool, to increase the space between structures 200.

In some embodiments, white dies 200 may have a size ranging from about 0.15 mm to about 5 mm; however, the size of white dies 200 is not a limitation of the present invention. In some embodiments, the thickness of phosphor 230 surrounding LEEs 210 may be substantially the same, for different size LEEs 210. In some embodiments, the size of white die 200 may be increased by the incorporation of multiple LEEs 210. In some embodiments, the size of white die 200 including multiple LEEs 210 is determined by the size and number of LEEs 210 and the thickness of phosphor 230 surrounding each LEE 210, and in some embodiments the thickness of phosphor 230 surrounding each LEE 210 in a multiple LEE 210 white die 200 may be substantially the same as the thickness of phosphor 230 surrounding a single LEE 210 white die 200. For example, a white die including a large array of LEEs 210 may have a lateral dimension of at least 3 mm, or at least 7 mm, or at least 25 mm. For some white dies 200, separation may be optional, for example in the case of large arrays of LEEs 210. Separation of phosphor 230 may be performed by a variety of techniques, for example laser cutting, cutting with a knife, die cutting, dicing, saw cutting, water jet cutting, ablation, or the like. In some embodiments, the kerf may be below about 200 μm or below about 100 μm or below about 50 μm or even below 25 μm. In some embodiments, the smaller the kerf, the larger number of white dies 200 that may be manufactured in a unit area—thus, decreasing the kerf typically results in a reduction in cost. This permits very large arrays of white dies 200 to be formed in a relatively small area with relatively high throughput and relatively low cost.

In preferred embodiments, the process to form the phosphor over and around the LEE is controlled to produce a relatively repeatable and uniform phosphor thickness, resulting in uniform optical characteristics. The ability to form a very large number of white dies 200 from a relatively small area of phosphor, in a relatively short time, to avoid or minimize settling of the phosphor powder in the binder, coupled with the relatively high thickness uniformity, leads to very large arrays of white dies 200 having relatively narrow distribution of optical characteristics, such as chromaticity, color temperature, color rendering index (CRI), luminous flux, etc. and very low manufacture cost. In one embodiment, an entire wafer of LEEs 210 may be batch processed simultaneously using this approach. For example in some embodiments LEEs 210 may be produced in wafer form, for example on a 2" or 4" or 6" or 8" diameter wafer. After LEEs 210 are fabricated and singulated (here singulation refers to singulation of the wafer on which LEEs 210 are formed), they may be transferred to mold substrate 410 for the white die process detailed herein. In some embodiments, the entire wafer of LEEs 210 may be transferred in batch mode (i.e., together) to mold substrate 410. In other embodiments, LEEs 210 may be transferred to mold substrate 410 die-by-die or in groups of dies.

In some embodiments, phosphor 230 includes or consists essentially of only a transparent binder that is transparent to a wavelength of light emitted by LEEs 210.

In some embodiments, the structure shown in FIG. 4F may be transferred to another substrate 411 such that contacts 220 are accessible, as shown in FIG. 4G. Such a transfer may be performed using transfer tape, a pick-and-place tool with a die flipper or any other technique. In some embodiments, this transfer may be done in batch mode (i.e., all dies at once), while in other embodiments it may be done die-by-die or for groups of dies. In some embodiments, the transfer may be performed before singulation of the white die wafer.

The result of this process is a white die 200, as shown in FIG. 2A. The process provides a batch method to produce dies integrated with phosphor and ACA, with uniform phosphor over each die, in a cost-effective way, before the dies are placed or integrated into any kind of package or onto a circuit board.

White dies 200 may then be removed from base 411 or 430 for placement in a package or on a substrate or circuit board. In some embodiments, white dies 200 may be used as is, without a package, for example by mounting on a flexible or rigid circuit or wiring board or in other lighting of illumination systems. In some embodiments, white dies 200 may be removed from base 411 or 430 and have ACA 292 available for electrical connection, as shown in, for example FIG. 2A.

Figure 5:
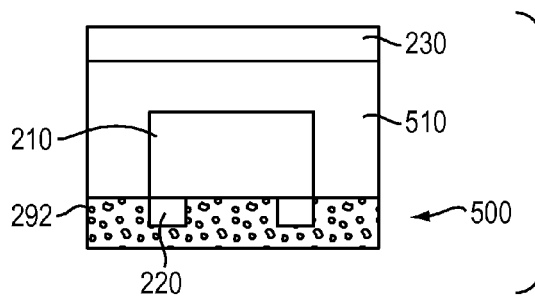
FIG. 5 is a cross-sectional schematic of a coated die in accordance with various embodiments of the invention.

In one embodiment, only one phosphor 420 is used; however, this is not a limitation of the present invention, and in other embodiments multiple phosphors are used. In one embodiment, phosphor 420 may include or consist essentially of multiple different phosphor powders in a binder. In one embodiment, a first phosphor 420 is deposited and cured or partially cured, followed by the deposition and curing of one or more successive phosphors. In one embodiment, a binder is deposited and cured or partially cured, and the binder is transparent to a wavelength of light emitted by LEE 210 and/or phosphor 420 or 230, followed by the deposition and curing of one or more phosphor 420, to form a layered structure in which one or more layers have a phosphor composition, type and/or thickness different from each other. In this way, a remote-phosphor white die 400 may be fabricated, as shown in FIG. 5. FIG. 5 shows one embodiment of a remote phosphor white die 500, in which phosphor 230 is spatially separated from LEE 210 by a transparent binder or matrix material 510. In such a structure, the extent of the overhang of the phosphor containing layer(s) 230 past the edges of LEE 210 may be varied to optimize the amount of light from LEE 210 that is absorbed by phosphor 230. Such an approach may also be used to form multiple layers of phosphor and/or transparent binder 510 on LEE 210.

Figure 6A:
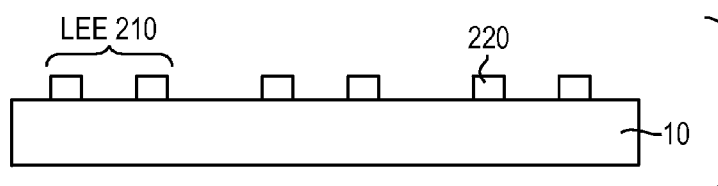
FIGS. 6A-6G are cross-sectional schematics of process steps utilized to fabricate coated dies in accordance with various embodiments of the invention.
Figure 6B:
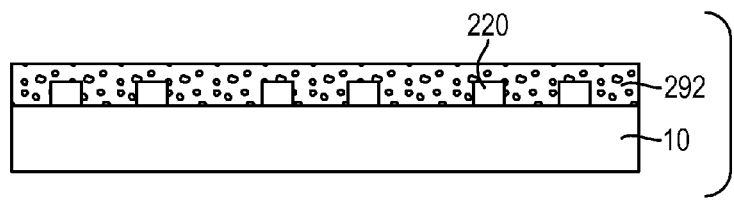
Figure 6C:
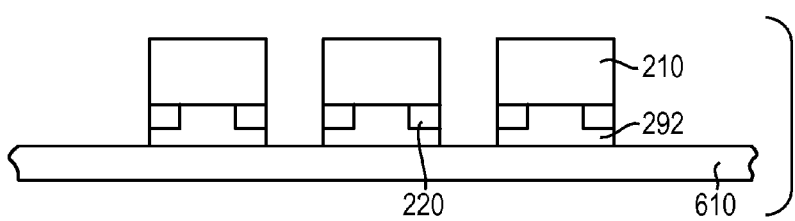

FIGS. 6A-6E depict one embodiment of process 301. In contrast to process 300, process 301 forms or attaches the ACA 292 to all or a portion of an unsingulated or partially singulated wafer of LEEs. FIG. 6A shows a wafer of unsingulated LEEs 210, identified as wafer 10, per step 315. FIG. 6B shows the structure of FIG. 6A at a later stage of manufacture, per step 325. In FIG. 6B, ACA 292 has been applied to the contact side of wafer 10. FIG. 6C shows the structure of FIG. 6B at a later stage of manufacture. In FIG. 6C the structure has been optionally mounted on base 610, with ACA 292 adjacent to base 610, and wafer 10 and ACA 292 have been singulated, per step 335. Singulation may be performed by any of a variety of techniques, for example scribing, sawing, dicing, laser cutting, water jet cutting, or the like. While FIG. 6C shows singulation occurring with ACA 292 adjacent to base 610, this is not a limitation of the present invention, and in other embodiments singulation may occur with the back side of wafer 10 adjacent to (and even contacting) base 610.

In some embodiments, it may be advantageous to provide a liner or protective layer to the outside surface of ACA 292 that faces away from the LEE 210. The protective layer may be a film, such as a mold release film, or another material such as PET. A property of the protective layer is that it does not itself include an adhesive material on the side facing the ACA 292. The protective layer is adjacent to base 610 during singulation step 335. In some embodiments, the protective layer is fully singulated during step 335. In other embodiments, for example in an embodiment where the protective layer includes an expandable material, the protective layer is optionally not singulated or is only partially singulated during step 335. For example the depth of the cut made by the singulation process may optionally extend only partially through the thickness of the protective layer.

In some embodiments, it may be advantageous to at least partially cure the ACA prior to performing step 335. In other embodiments, it might be advantageous to partially cure the ACA, or further cure the ACA partially, prior to molding.

Figure 6D:
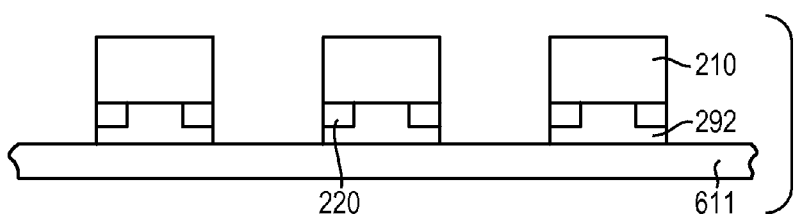

In some embodiments, it may be advantageous to increase the spacing between LEEs 210 prior to molding. In some embodiments, increasing the spacing is accomplished by using a temporary substrate that is expandable, for example an expandable dicing tape, for example Tape 18733 from Semiconductor Equipment Corporation, using a die expander tool, for example a model 1810 die matrix expander manufactured by Semiconductor Equipment Corporation. In some embodiments the liner or protective layer discussed above may be expandable. The expandable tape is stretched, for example using a die matrix expander tool, to increase the space between LEEs 210. In one embodiment, this may be done by transferring the structures to a second base such that the pitch between LEEs on the second base is larger, for example using a pick-and-place tool. In step 310 a base is provided, and in step 321 the LEEs and ACA are formed or placed on the base. These steps may be accomplished by using the singulation base (if present) or a different base. The type of base and whether the spacing is increased or not, or whether base 610 is used as a molding base or LEE 210 are transferred to another base, are not limitations of the present invention. The mold base 611 as shown in FIG. 6D may be similar to other mold bases described herein and in some embodiments may be the same as singulation base 610.

Figure 6E:
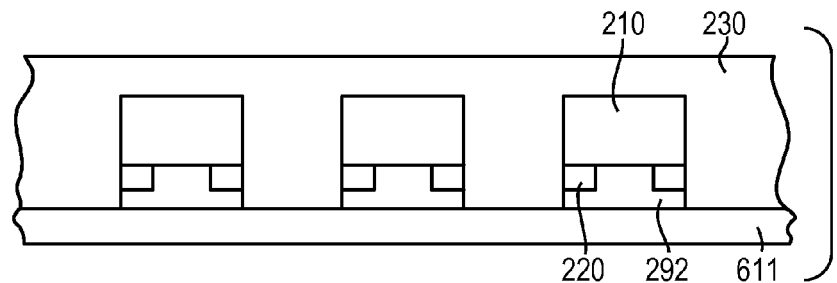
Figure 6F:
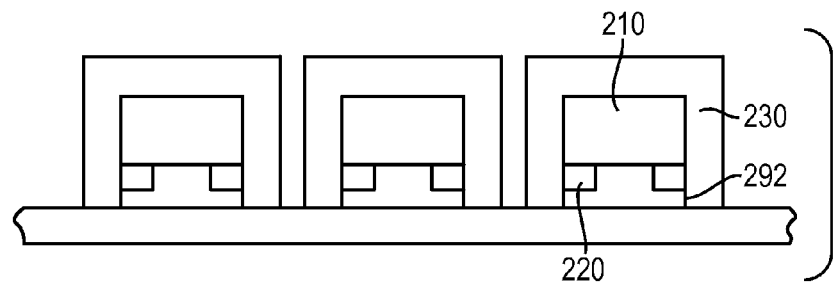

As discussed herein with respect to step 330 (provide phosphor), step 340 (form phosphor over LEEs and the base) and step 350 (cure phosphor), the steps described in process 301 may be performed in a similar fashion. FIG. 6E shows the structure of FIG. 6D after formation and curing or partial curing of the phosphor. FIG. 6F shows the structure of FIG. 6E at a later stage of manufacture. In this process it may be preferable to choose an ACA that is not fully cured by the thermal budget of the phosphor cure process. In FIG. 6F the structure of FIG. 6E has been separated or singulated, per step 360 of process 301.

As discussed herein, in some embodiments, the structure shown in FIG. 6F may be transferred to another substrate such that contacts 220 are electrically accessible via ACA 292. Such a transfer may be performed using transfer tape, a pick-and-place tool with a die flipper or any other technique. In some embodiments, this transfer may be done in batch mode, while in other embodiments it may be done die-by-die or in groups of dies. In some embodiments, the transfer may be performed before singulation of the white die wafer. The result of this process 301 is a white die 200, as shown, for example, in FIG. 6G. The process provides a batch method to produce dies integrated with phosphor and ACA, with uniform phosphor over each die, in a cost-effective way, before the dies are placed or integrated into any kind of package or onto a circuit board.

White dies 200 may then be removed from the substrate for placement in a package or on a substrate or circuit board. In some embodiments, white dies 200 may be used as is, without a package, for example by mounting on a flexible or rigid circuit or wiring board or in other lighting of illumination systems. In some embodiments, white dies 200 may be removed from the temporary base and have ACA 292 available for electrical connection, as shown in, for example FIG. 2B or 6G.

Figure 6G:
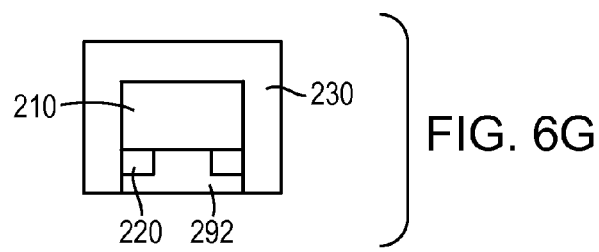
Figure 7A:
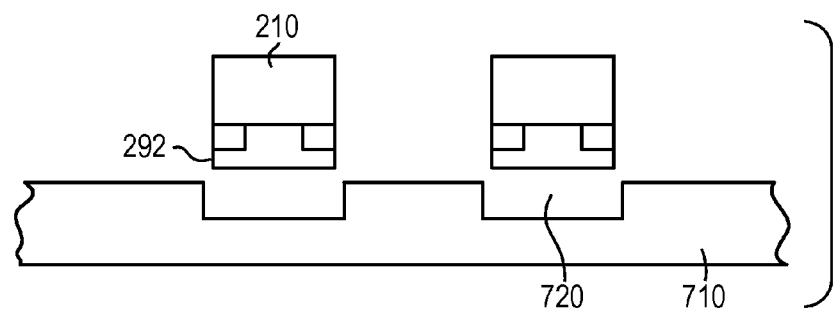
FIG. 7A is a cross-sectional schematic of device structures on a substrate patterned to control die relief of coated dies incorporating the light-emitting elements in accordance with various embodiments of the invention.
Figure 7B:
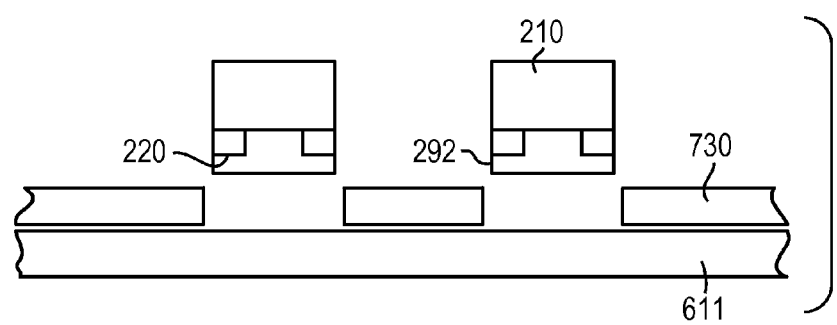
FIG. 7B is a cross-sectional schematic of device structures on a substrate with a mask to control die relief of coated dies incorporating the light-emitting elements in accordance with various embodiments of the invention.

FIG. 6G shows the bottom surface of ACA 292 as coplanar or substantially coplanar with the bottom of phosphor 230; however, this is not a limitation of the present invention and in other embodiments ACA 292 and/or all or a portion of contacts 220 and/or a portion of LEE 210 may be proud of phosphor 230, as shown in FIG. 2B. In other words, the ACA and/or contact and/or die relief may be positive or negative. In one embodiment, the structure of FIG. 2B may be achieved by using a mold substrate 710 having recesses 720 into which the LEEs 210 and ACA 292 fit, as shown in FIG. 7A. In another embodiment, the structure of FIG. 2B may be achieved by using a flat mold substrate 611 and a mask or stencil 730 overlaying a portion of substrate 611, as shown in FIG. 7B.

Figure 8A:
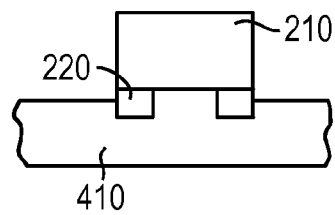
FIGS. 8A-8D are cross-sectional schematics of device structures on a substrate showing techniques of controlling die relief of coated dies incorporating light-emitting elements in accordance with various embodiments of the invention.
Figure 8B:
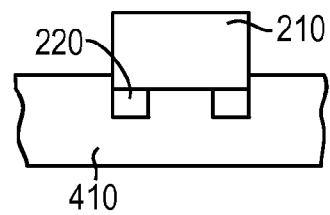
Figure 8C:
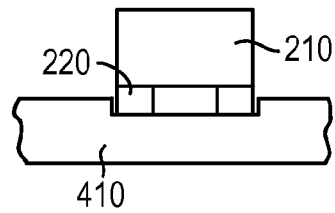
Figure 8D:
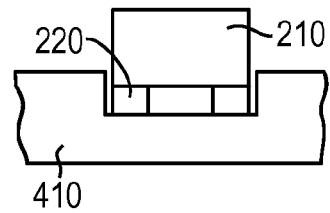

As shown in FIG. 2C, contact and die relief may also be controlled in a structure in which ACA 292 covers more than the exposed face of LEE 210. FIGS. 8A-8D show several exemplary approaches. In one embodiment, all or a portion of contacts 220 may be embedded in base 410 before molding of phosphor 230, as shown in FIG. 8A. In one embodiment, all or a portion of contacts 220 and a portion of LEE 210 may be embedded in base 410 before molding of phosphor 230, as shown in FIG. 8B. In one embodiment, base 410 may have recesses into which all or a portion of contacts 220 are recessed, as shown in FIG. 8C. In one embodiment, base 410 may have recesses into which all or a portion of contacts 220 and a portion of LEE 210 may be recessed, as shown in FIG. 8D.

Figure 9A:
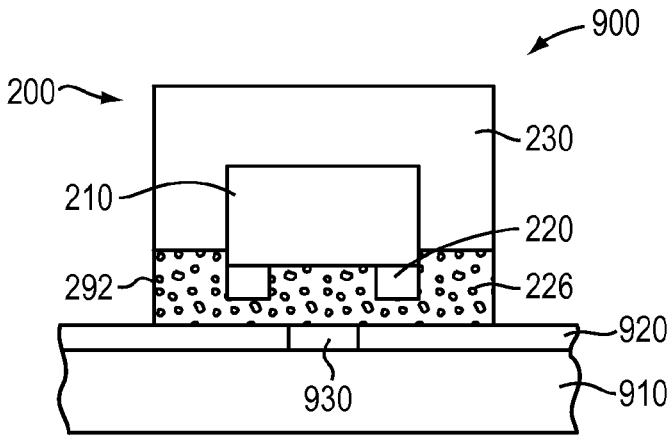
FIGS. 9A and 9B are cross-sectional schematics of device structures on a substrate in accordance with various embodiments of the invention.

After singulation and optional expansion, ACA white dies 200 may be attached to a substrate featuring one or more conductive elements, such that the one or more contacts 220 are electrically coupled to one or more conductive elements on the substrate through ACA 292. FIG. 9A shows structure 900 featuring substrate 910 over which conductive elements 920 are formed and an ACA white die 200 positioned over substrate 910 in a flip-chip mounting configuration where contacts are positioned over conductive traces 920 with a portion of ACA 292 between contacts 220 and conductive traces 920. Conductive traces 920 are configured with a gap 930 between adjacent conductive traces 920 and ACA white die 200 is positioned over gap 930 such that all or a portion of a first contact 220 is over a portion of a first conductive element 920 and all or a portion of second contact 220 is positioned over a second conductive element 920. Contacts 220 are separated from conductive traces 920 by ACA 292.

In some embodiments, ACA 292 is activated or cured, for example by using heat, pressure, radiation (e.g., visible or UV light), magnetic field, or a combination of two or more of these activation methods, to create a conductive path between contacts 220 and conductive elements 920. In one embodiment, ACA 292 is activated using a combination of heat and pressure. After positioning as shown in FIG. 9A, pressure and heat are applied to activate ACA 292, resulting in the structure shown in FIG. 9B. Positioning of dies 200 on substrate 910 may be performed by any technique; a common method of positioning is to utilize a pick-and-place tool that removes dies 200 from base 430 or 411 (FIGS. 4F and 4G respectively) and places them over conductive elements 920. In some embodiments, the temperature for curing is in the range of about 70° C. to about 250° C., the pressure is in the range of about 4 gm to about 800 gm force for a 20,000 $\mu m^2$ contact pad, and the curing time is in the range of about 10 seconds to about 30 minutes. In other embodiments, the bonding pressure (or force) is measured in Newtons, and an appropriate bonding force is in the range of about 0.01 to about 2.0 N for an area of about 5000 $\mu m^2$. The force, temperature and time ranges used are dependent on the specific type of ACA 292 and are not a limitation of the present invention. In some embodiments, pressure is applied by compressing the substrate and individual dies between two substantially rigid surfaces. In some embodiments, pressure is applied by compressing the substrate and individual dies between a substantially rigid surface and a substantially compliant surface.

Figure 9B:
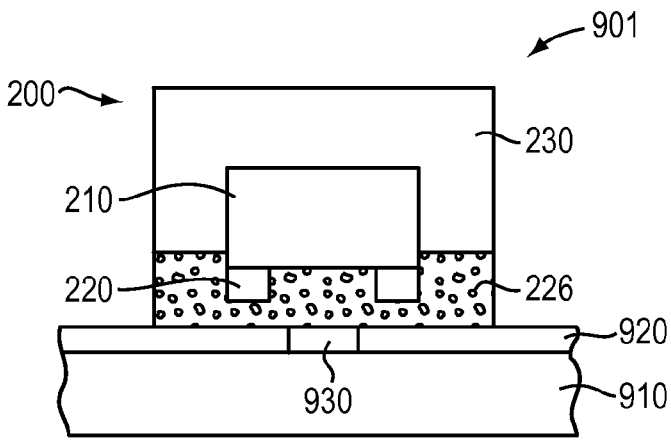

FIG. 9B shows a view of the bonding region, showing an example of a bonded structure 901 after curing or activation of ACA 292. As shown in FIG. 9B, ACA 292 is compressed such that one or more conductive particles 226 form a conductive path between one contact 220 and one conductive element 920. There is no electrical coupling between adjacent conductive elements 920 because the conductive particles 226 do not form an electrically continuous bridge between the two adjacent conductive traces. While FIG. 9B shows one conductive particle 226 forming the conductive path between a contact 220 and a conductive element 920, this is not a limitation of the present invention, and in other embodiments more than one conductive particle 226 may form the conductive path between contact 220 and conductive element 920.

The structures described above may be combined with additional electronics to form an electronic device 903 as shown in FIG. 9C. In one embodiment, the device includes multiple ACA white dies 200 that are electrically coupled to traces 920. As shown, electronic device 903 includes three serially-connected strings 980 of white dies 200. Electronic device 903 also includes circuitry 990 electrically connected to one or more of strings 980. Circuitry 990 may include or consist essentially of portions or substantially all of the drive circuitry, sensors, control circuitry, dimming circuitry, and or power-supply circuitry or the like, and may also be adhered (e.g., via an adhesive) or otherwise attached to substrate 910. In one embodiment, the power supply and driver are distributed, e.g., the device 903 may have a centralized power supply and all or a portion of the drive circuitry distributed in different locations. Circuitry 990 may even be disposed on a circuit board (e.g., a printed circuit board) that itself may be mechanically and/or electrically attached to substrate 910. In other embodiments, circuitry 990 is separate from substrate 910. In some embodiments circuitry 990 is formed on substrate 910. While FIG. 9C depicts white dies 200 electrically coupled in serially connected in strings 980, and strings 980 connected or connectable in parallel, other die-interconnection schemes are possible and within the scope of embodiments of the invention.

As shown in FIG. 9C, the lighting system 903 may feature multiple strings, each string 980 including or consisting essentially of a combination of one or more white dies 200 electrically connected in series, in parallel, or in a series-parallel combination with optional fuses, antifuses, current-limiting resistors, zener diodes, transistors, and other electronic components to protect white die 200 from electrical fault conditions and limit or control the current flow through individual white dies 200. In general, such combinations feature an electrical string that has at least two electrical connections for the application of DC or AC power. A string may also include a combination of one or more white dies 200 electrically connected in series, in parallel, or in a series-parallel combination of white dies 200 without additional electronic components. FIG. 9C shows three strings of white dies 200, each string having three white dies 200 in series; however, this is not a limitation of the present invention, and in other embodiments the number of strings is less than or greater than three and the number of white dies 200 in a string is greater or less than three. In one embodiment, a string includes at least ten white dies 200. In one embodiment, a string includes at least 45 white dies 200. In one embodiment, system 903 includes at least ten strings. In one embodiment, system 903 includes at least 50 strings.

LEE substrate 910 may include or consist essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper. In one embodiment, LEE substrate 910 includes or consists essentially of PET and has a thickness in the range of about 10 µm to about 150 µm. LEE substrate 910 may also include or consist essentially of a rigid or flexible circuit board, for example FR4, metal core printed circuit board (MCPCB), polyimide or the like. LEE substrate 910 may be substantially flexible, substantially rigid or substantially yielding. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

LEE substrate 910 may include multiple layers, e.g., a deformable layer over a rigid layer, for example, a semicrystalline or amorphous material, e.g., PEN, PET, polycarbonate, polyethersulfone, polyester, polyimide, polyethylene, paint, plastic film and/or paper formed over a rigid or substantially rigid substrate for example including, ceramic such as AlN, fiberglass, such as FR-4, metal core printed circuit board, acrylic, aluminum, steel and the like. In some embodiments, LEE substrate 910 is rigid or substantially rigid, for example including silicon, ceramic such as AlN, fiberglass, such as FR-4, metal core printed circuit board, acrylic, aluminum, steel and the like.

Depending upon the desired application for which embodiments of the invention are utilized, LEE substrate 910 is substantially optically transparent, translucent, or opaque. For example, LEE substrate 910 may exhibit a transmittance or a reflectivity greater than about 80% for optical wavelengths ranging between approximately 400 nm and approximately 700 nm. In some embodiments, LEE substrate 910 exhibits a transmittance or a reflectivity of greater than about 80% for one or more wavelengths emitted by LEE 210 and/or white die 200. In some embodiments a reflective LEE substrate 910 advantageously aids in directing light in a desired direction, while in some embodiments a transmissive LEE substrate 910 may provide a relatively transparent appearance or may permit light emission from both sides of LEE substrate 910.

LEE substrate 910 may also be substantially insulating, and may have an electrical resistivity greater than approximately 100 ohm-cm, greater than approximately $1 \times 10^6$ ohm-cm, or even greater than approximately $1 \times 10^{10}$ ohm-cm.

Conductive traces 920 may include or consist essentially of any conductive material, for example metals such as gold, silver, aluminum, copper, carbon and the like, conductive oxides, carbon, etc. Conductive traces 920 may be formed on LEE substrate 910 by a variety of techniques, for example evaporation, sputtering, physical deposition, chemical vapor deposition, plating, electroplating, printing, lamination, gluing using an adhesive, lamination and patterning or the like. In one embodiment, conductive traces 920 are formed using printing, for example screen printing, stencil printing, flexo, gravure, ink jet, or the like. Conductive traces 920 may include or consist essentially of silver, aluminum, copper, gold, carbon inks, or other conductive inks or the like. Conductive traces 920 may include or consist essentially of a transparent conductor, for example, a transparent conductive oxide such as indium tin oxide (ITO). Conductive traces 920 may include or consist essentially of a plurality of materials. Conductive traces 920 may optionally feature stud bumps to aid in electrical coupling of conductive trace 920 to contacts 220. Conductive traces 920 may have a thickness in the range of about 0.05 µm to about 100 µm; however, this is not a limitation of the present invention, and in other embodiments conductive traces 920 may have any thickness. While the thickness of one or more of the conductive traces 920 may vary, the thickness is generally substantially uniform along the length of the conductive trace 920 to simplify processing. However, this is not a limitation of the present invention and in other embodiments the conductive trace thickness or material varies. In one embodiment, LEE substrate 910 includes or consists essentially of PET having a thickness in the range of about 10 µm to about 150 µm, and conductive traces 920 include or consist essentially of either copper or aluminum and have a thickness in the range of about 5 µm to about 100 µm.

Figure 10D:
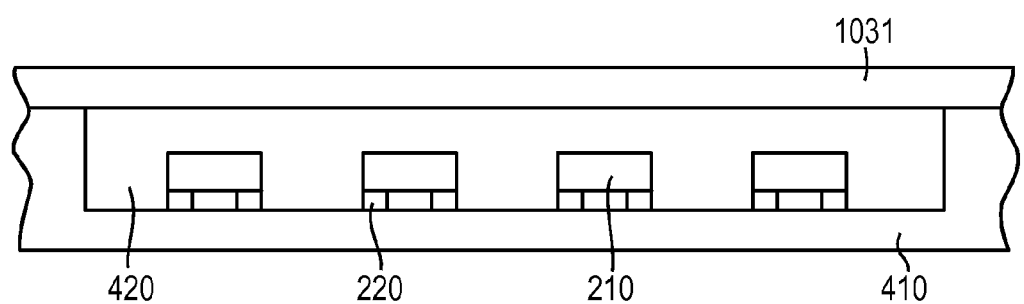

While FIG. 2A shows phosphor 230 having a square or rectangular shape around LEE 210, this is not a limitation of the present invention. In some embodiments, phosphor 230 is shaped by a mold 1030 that includes or consists essentially of one or more compartments, depressions, or wells 1020 into which LEEs 210 will be inserted or partially inserted or over or under which LEEs 210 will be suspended (for example, if barriers separating the compartments do not extend sufficiently far to form fully closed compartments), as shown in FIG. 10A. In another embodiment, wells 1020 are formed by insertion of a template into an open mold (such as that shown in FIG. 4B). Wells 1020 are filled or partially filled with phosphor 420, for example by dispensing, by the doctor blade method, stencil printing, or by other means. Following formation of phosphor 420 in wells 1020, temporary carrier or base 410 is mated with mold 1030 such that LEEs 210 are fully or partially immersed in phosphor 420, as shown in FIG. 10B. Contacts 220 are adhered to temporary carrier 410, preventing phosphor 420 from covering at least a portion of contacts 220. In one embodiment, phosphor 420 is introduced or injected into wells 1020 after mold 1030 is mated with base 410. In one aspect of this embodiment, a partial vacuum may be used to enhance transport of phosphor 420 to all wells 1020 and to partially or fully degas phosphor 420 before curing. The process may include or consist essentially of injection molding, transfer molding, compression molding, casing, etc. Compression molding may be carried out using equipment such as a FFT-103 manufactured by Towa Corporation. In some embodiments, mold 1030 is flat, i.e., effectively including only one depression 420 into which fits multiple LEEs 210. In one embodiment, the structure of FIG. 10B is flipped, with base 410 on the bottom and mold 1030 on top, such that phosphor 420 is formed over base 410 and LEE 210, over which a top portion 1031 of the mold 1030 is formed and in one embodiment of this example mold 1030 is a flat surface. For example, the structure of FIG. 4B may be filled or overfilled with phosphor 420, after which a mold top or cover 1031 is applied, as shown in FIG. 10D. The shape of mold 1030 is not a limitation of the present invention and in other embodiments mold 1030 has any shape. In some embodiments, both base 410 and mold 1030 have raised barriers or sidewalls. As discussed herein, a pattern, roughness or texture in all or a portion of the outer surface of phosphor 230 may be formed by introducing those features into the surface of all or portions of the surface of the mold. In some embodiments, different LEEs 210 on base 410 have differently shaped phosphors formed around them.

In some embodiments all or a portion of mold 1030 is covered by a mold release material. In some embodiments, the mold release material is a mold release film. In some embodiments, the mold release material or mold release film may be patterned, roughened or textured to, e.g., impart similar features on all or portions of the outer surface of phosphor 230. In some embodiments, the mold release material or mold release film may be smooth or substantially smooth.

FIGS. 11A-11D depict several embodiments of ACA white dies 200 that may be fabricated with a shaped mold. The structure of FIG. 11A has a substantially flat top and a reduced amount of phosphor over the corners of LEE 210 than over the center of LEE 210. The structure of FIG. 11B has a non-smooth, for example textured, rough, or patterned, surface 1110. In one embodiment, the non-smooth surface 1110 reduces total internal reflection (TIR) within phosphor 230 and achieves improved light extraction. In one embodiment surface 1110 may have a periodic structure; however, this is not a limitation of the present invention, and in other embodiments the structure may be random. In one embodiment surface 1110 include light extraction features (e.g., raised bumps and/or depressions) having a dimension in the range of about 0.25 µm to about 15 µm; however, this is not a limitation of the present invention, and in other embodiments the light extraction features may have other dimensions. In one embodiment, the light extraction features may be hemispherical or pyramidal in shape; however, this is not a limitation of the present invention, and in other embodiments the light extraction features may have any shape. In one embodiment the light extraction feature is a random texture or roughness with an average roughness in the range of about 0.25 µm to about 15 µm. In the structure of FIG. 11C, the phosphor is shaped in a rounded shape. Such a rounded shape may be a hemisphere, a paraboloid, a Fresnel optic or any other shape.

The structure of FIG. 11D has a photonic crystal 1120 formed on the top surface. In one embodiment, the photonic crystal 1120 increases the intensity of light exiting white die 200 in a specific direction, for example perpendicular to the face of white die 200. In other embodiments, a photonic crystal is formed on all or a portion of any surface of white die 200. FIG. 11E shows a portion of a white wafer having contiguous molded shapes over LEEs 210. In some embodiments, the structure shown in FIG. 11E may produce more white dies 200 per unit area than the structure shown in FIG. 11F, and this may be advantageous from a manufacturing cost point of view. In some embodiments, this is singulated, for example at the joining line 1130 to form individual white dies 210, while in other embodiments a white die 210 may include a plurality of LEEs 210 with a plurality of shaped phosphors 230, as shown in FIG. 11F. As shown in FIG. 11F, the shaped phosphors 230 may be connected by a thin region 1150. In some embodiments region 1150 may be advantageously minimized to reduce the consumption of unused phosphor, for example by minimizing the thickness and/or lateral extent of region 1150. However, this is not a limitation of the present invention, and in other embodiments region 1150 may have any shape or size or may be absent, as described herein.

In one embodiment, the phosphor may be shaped by forming a white die as shown in FIG. 2A or a white die wafer as shown in FIG. 4C and then removing one or more portions of the phosphor to produce a shape different from the starting shape. Removal of one or more portions of the phosphor may be accomplished using a variety of means, for example knife cutting, dicing, laser cutting, die cutting, ablation or the like.

Figure 12B:
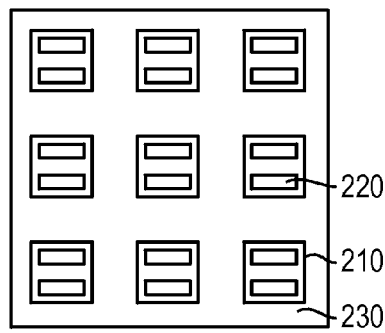
FIGS. 12B and 12C are plan-view schematics of device structures in accordance with various embodiments of the invention.
Figure 12C:
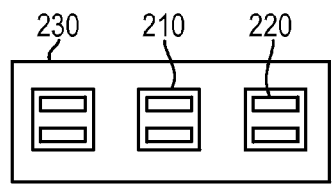

While the examples herein generally show LEEs 210 spaced in a regular periodic array on base 410, this is not a limitation of the present invention, and in other embodiments LEEs 210 are arrayed or spaced in any fashion on base 410. While the examples herein show rectangular LEEs 210, this is not a limitation of the present invention, and in other embodiments the LEE 210 are square, triangular, hexagonal, round or any other shape. The examples discussed above for white die 200 show one LEE 210 in each white die 200. However, this is not a limitation of the present invention and in other embodiments each white die 200 includes a plurality of LEE 210, as shown in FIGS. 12A-12C. FIG. 12A shows a cross-sectional view of a multi-LEE white die incorporating five LEEs 210. FIG. 12B shows a plan view of a multi-LEE white die incorporating nine LEEs 210 in a 3×3 array. FIG. 12C shows a plan view of a multi-LEE white die incorporating four LEEs 210 in a 1×4 array. The examples in FIG. 12A-12C show rectangular white dies; however, this is not a limitation of the present invention, and in other embodiments the white die are square, triangular, hexagonal, round or any other shape. In FIGS. 12B and 12C, ACA 292 is not shown to illustrate the position of LEE 210 within the structure. The examples in FIG. 12A-12C show LEEs 210 in a regular periodic array; however, this is not a limitation of the present invention, and in other embodiments LEEs 210 are arrayed or spaced in any fashion.

Examples discussed above for white dies 200 show white dies 200 as being square and having sidewalls perpendicular to the contact face of LEE 210. However, this is not a limitation of the present invention and in other embodiments white die 200 is rectangular, hexagonal, circular, triangular, or has any arbitrary shape, and/or has sidewalls forming any angle with respect to the surface of LEE 210 including contacts 220. While the term white die, for example related to white die 200, has been used to describe a structure producing white light, this is not a limitation of the present invention, and in other embodiments, different color LEEs 210 and different phosphors (one or more) may be used to produce other colors, for example amber, green or any arbitrary color or spectral power distribution. In other embodiments, a white die 200 includes multiple LEEs 210. In some embodiments, the LEEs 210 are all the same, while in other embodiments the LEEs 210 include two or more groups of different LEEs 210, for example emitting at different wavelengths. In some embodiments, an LEE 210 may include or consist essentially of an organic light emitter.

Figure 13A:
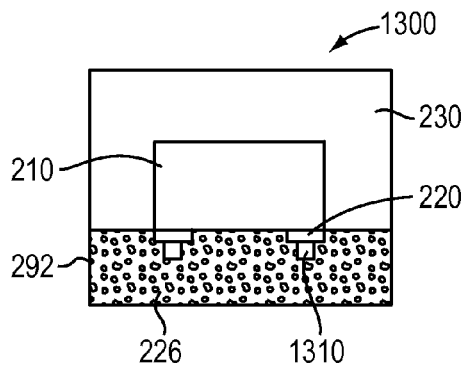
FIGS. 13A and 13B are cross-sectional schematics of device structures in accordance with various embodiments of the invention.
Figure 13B:
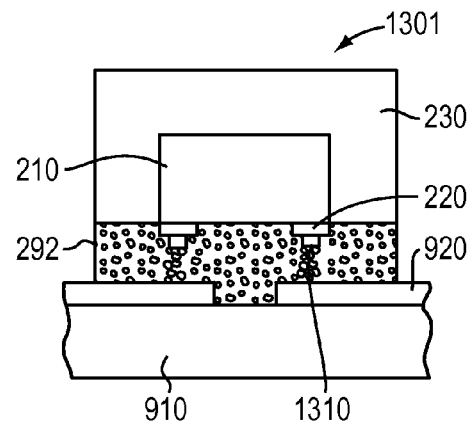

While examples discussed above utilize ACA without stud bumps, this is not a limitation of the present invention and in other embodiments stud bumps may be utilized to aid in making electrical contact between the ACA and the electrical traces on a substrate. FIG. 13A shows structure 1300 that is similar to white die 200 of structure 900 (separate from substrate 910 and conductive traces 920) of FIG. 9A, but with the addition of stud bumps 1310. FIG. 13B shows structure 1301, similar to structure 901 of FIG. 9B, after curing of ACA 292, showing ACA particle 226 between stud bump 1310 and conductive trace 920.

Figure 14A:
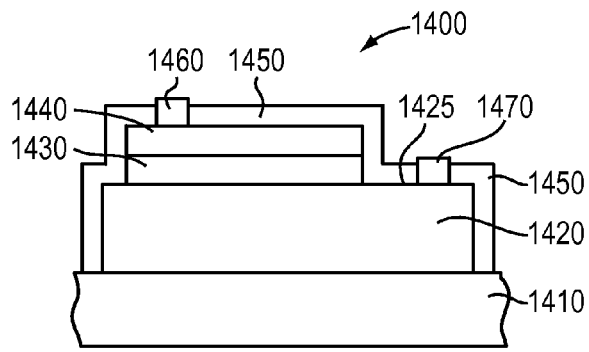
FIGS. 14A and 14B are, respectively, a cross-sectional schematic and a plan-view schematic of a light-emitting element utilized in coated dies in accordance with various embodiments of the invention.
Figure 14B:
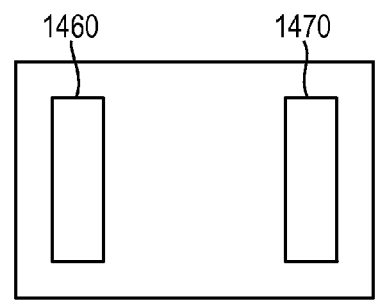

In one embodiment, die 210 includes or consists essentially of an LEE die, for example an LED or laser. FIGS. 14A and 14B depict an exemplary LEE 1700 for use in an embodiment of the present invention. FIG. 14A shows a cross-sectional view, while FIG. 14B shows a top plan view of LEE 1400. LEE 1400 typically includes a substrate 1410 with one or more semiconductor layers disposed thereover. In this exemplary embodiments, LEE 1400 represents a light-emitting device such as a LED or a laser, but other embodiments of the invention feature one or more semiconductor dies with different or additional functionality, e.g., processors, sensors, photovoltaic solar cells, detectors, and the like. Different LED dies or non-LED dies may have contact geometries differing from those of LEDs. While FIGS. 14A and 14B show LEE 1400 having non-coplanar contacts 1460 and 1470, this is not a limitation of the present invention and in other embodiments LEE 1400 may have coplanar or substantially coplanar contacts, as shown in FIG. 2A.

Substrate 1410 may include or consist essentially of one or more semiconductor materials, e.g., silicon, GaAs, InP, GaN, and may be doped or substantially undoped (e.g., not intentionally doped). In some embodiments, substrate 1410 includes or consists essentially of sapphire or silicon carbide. Substrate 1410 may be substantially transparent to a wavelength of light emitted by the LEE 1400. As shown for a light-emitting device, LEE 1400 may include first and second doped layers 1420, 1440, which preferably are doped with opposite polarities (i.e., one n-type doped and the other p-type doped). One or more light-emitting layers 1430, e.g., one or more quantum wells, may be disposed between layers 1420, 1440. Each of layers 1420, 1430, 1440 may include or consist essentially of one or more semiconductor materials, e.g., silicon, InAs, AlAs, GaAs, InP, AlP, GaP, InSb, GaSb, AlSb, GaN, AlN, InN, and/or mixtures and alloys (e.g., ternary or quaternary, etc. alloys) thereof. In preferred embodiments, LEE 1400 is an inorganic, rather than a polymeric or organic, device.

As shown in FIGS. 14A and 14B, in some embodiments LEE 1400 is patterned and etched (e.g., via conventional photolithography and etch processes) such that a portion of layer 1420 is exposed in order to facilitate electrical contact to layer 1420 and layer 1440 on the same side of LEE 1400 (and without, for example, the need to make contact to layer 1420 through substrate 1410 or to make contact to layer 1420 with a shunt electrically connecting a contact pad over layer 1440 to layer 1420). One or more portions of layers 1430, 1440 are removed (or never formed) in order to expose a portion of layer 1420, and thus FIG. 14A depicts a surface 1425 of LEE 1400 that is non-planar, i.e., contains exposed portions non-coplanar with each other. Surface 1425 corresponds to the outer surface of LEE 1400, including any contour or topography resulting from portions of layers not being present. In order to facilitate electrical contact to LEE 1400, discrete electrical contacts 1460, 1470 are formed on layers 1440, 1420, respectively. Electrical contacts 1460, 1470 may each include or consist essentially of a suitable conductive material, e.g., one or more metals or metal alloys, conductive oxides, or other suitable conductive materials and are generally non-coplanar (particularly in embodiments when having approximately equal thicknesses), as depicted in FIG. 14A. In some embodiments, surface 1425 is planar or substantially planar. In some embodiments, the top surfaces of electrical contacts 1460 and 1470 are coplanar or substantially coplanar. The structure shown in FIGS. 14A and 14B is for illustrative purposes. There are a wide variety of designs for LEE 210 or LEE 1400, and the specific design of LEE 210 or LEE 1400 is not a limitation of the present invention. For example, in some embodiments LEE 210 or LEE 1400 may have different shaped contacts, different area contacts, different approaches to contact the semiconductor material or the like.

In some embodiments, LEE 1400 has a square shape, while in other embodiments LEE 1400 has a rectangular shape. The shape and aspect ratio are not critical to the present invention, however, and LEE 1400 may have any desired shape. In various embodiments, the extent of one or both of contacts 1460, 1470 in one dimension (e.g., a diameter or side length) is less than approximately 100 µm, less than approximately 70 µm, less than approximately 35 µm, or even less than approximately 20 µm. In one embodiment, contacts 1460, 1470 are rectangular and may have a length in the range of about 10 µm to about 250 µm and a width in the range of about 5 µm to about 250 µm. In some embodiments, contacts 1460, 1470 have one dimension that is at least 200 µm or that is at least 500 µm. In other embodiments, contacts 1460, 1470 have any shape or size, and in some embodiments LEE 1700 has more than two contacts. The number, shape and aspect ratio of the contacts are not critical to the present invention, however, and contacts 1460, 1470 may have any desired number, shape and/or size. In some embodiments, the separation between contacts 1460 and 1470 is at least 50 µm, or at least 100 µm, or at least 200 µm. In some embodiments, contacts 1460 and 1470 are separated as far as possible within the geometry of LEE 1400. For example, in one embodiment the separation between contacts 1460 and 1470 is in the range of about 75% to over 90% of the length of LEE 1400; however, the separation between contacts is not a limitation of the present invention.

Particularly if LEE 1400 includes or consists essentially of a light-emitting device such as a LED or laser, contacts 1460, 1470 may be reflective to a wavelength of light emitted by LEE 1400) and hence reflect emitted light back toward substrate 1410. In some embodiments, a reflective contact 1460 covers a portion or substantially all of layer 1440, while a reflective contact 1470 covers a portion or substantially all of exposed layer 1420. In addition to or instead of reflective contacts, a reflector (not shown in this figure for clarity) may be disposed between or above portions of contacts 1460, 1470 and over portions or substantially all of layer 1440 and 1420. The reflector is reflective to at least some or all wavelengths of light emitted by LEE 1400 and may include or consist essentially of various materials. In one embodiment, the reflector is non-conductive so as not to electrically connect contacts 1460, 14870. In some embodiments, the reflector may be a Bragg reflector. In some embodiments, the reflector may include or consist essentially of one or more conductive materials, e.g., metals such as silver, gold, platinum, etc. Instead of or in addition to the reflector, exposed surfaces of semiconductor die except for contacts 1460, 1470 may be coated with one or more layers of an insulating material, e.g., a nitride such as silicon nitride or an oxide such as silicon dioxide. In some embodiments, contacts 1460, 1470 include or consist essentially of a bond portion for connection to a circuit board or power supply or the like and a current-spreading portion for providing more uniform current through LEE 1400, and in some embodiments, one or more layers of an insulating material are formed over all or portions of LEE 1400 except for the bond portions of contacts 1460, 1470. Insulating material 1450 may include or consist essentially of, for example, polyimide, silicon nitride, silicon oxide and/or silicon dioxide. Such insulating material 1450 may cover all or portions of the top and sides of LEE 1400 as well as all or portions of the top and sides of layers 1420, 1430 and 1440. Insulating material 1450 may act to prevent shorting between contacts 1460 and 1470 and between conductors to which contacts 1460 and 1470 may be electrically coupled.

FIG. 15 shows one embodiment of white die 200 incorporating an LEE 1400 as described above. White die 200 as shown in FIG. 15 may be manufactured in accordance with any of various embodiments of the present invention. FIG. 15 shows ACA 292 overlaying and/or laminated to semiconductor die 1400. As described above, ACA 292 is generally formed over multiple semiconductor dies 1400 prior to singulation. In some embodiments, ACA 292 is completely or substantially conformal to the surface of semiconductor dies 1400 and/or phosphor 230. However, this is not a limitation of the present invention, and in other embodiments ACA 292 is not conformal or substantially conformal to the surface of semiconductor dies 1400 and/or phosphor 230.

In some embodiments, phosphor 230 absorbs a portion of the incident short-wavelength radiant flux from LEE 210 and re-emits long-wavelength radiant flux. In an exemplary YAG:Ce phosphor a blue LED typically has a peak wavelength of 440 nm-470 nm, corresponding to the peak of the phosphor-excitation spectrum, while the phosphor emission has a broadband spectrum with a peak at approximately 560 nm. Combining the blue LED emission with the yellow phosphor emission yields visible white light with a specific chromaticity (color) that depends on the ratio of blue to yellow light. Herein, "white light" may be white or any other color that is produced by a combination of light from one or more light emitters and one or more light-conversion materials. Herein, phosphor may refer to one or more phosphors producing a desired spectral power density. Advantageously, embodiments of the present invention produce white dies 200 having controlled phosphor thickness, uniformity, and distribution of phosphor particles in the binder around LEE 210, for example, a uniform or substantially uniform thickness and uniform or substantially uniform distribution of phosphor particles in the binder, or an engineered thickness and distribution of phosphor particles to achieve uniform or otherwise specified optical characteristics. The thickness and distribution, or loading, of the phosphor particles may have a strong impact on the uniformity of the color temperature of the light. In systems with multiple LEEs, and in particular arrays with tens to thousands of LEEs, it may be difficult to achieve such phosphor coating over all of the LEEs when utilizing conventional phosphor-integration techniques, resulting in non-uniform optical characteristics. The aforementioned method for fabrication of uniform thickness and composition phosphor as part of white die 200 results in a reduction in the variation in color temperature and thus a more uniform color temperature light source, both within a lighting system featuring an array of phosphor-converted LEEs, as well as between such lighting systems. The use of the aforementioned LEEs in lighting systems featuring large arrays of LEEs permits the manufacture of large numbers of lighting systems having uniform color temperatures. In some embodiments, white dies 200 are manufactured that have a distribution of color temperature less than about 500K, or less than about 250K, or less than about 125K, or less than about 75K. In some embodiments, white dies 200 are manufactured that have a variation in color temperature or chromaticity of less than about four MacAdam ellipses, or less than about two MacAdam ellipses, or less than about one MacAdam ellipse. In some embodiments, such tight distributions are achieved within one white wafer, or within a batch of white wafers or within the entire manufacturing distribution.

In some embodiments, substantially all or a portion of substrate 1410 is removed prior to formation of the phosphor, as described below. Such removal may be performed by, e.g., chemical etching, laser lift-off, exfoliation, mechanical grinding and/or chemical-mechanical polishing, or the like. In some embodiments, all or a portion of substrate 1410 may be removed and a second substrate—e.g., one that is transparent to or reflective of a wavelength of light emitted by LEE 1400—is attached to substrate 1410 or semiconductor layer 1420 prior to formation of the phosphor as described herein. In some embodiments, substrate 1410 includes or consists essentially of silicon, and all or a portion of silicon substrate 1410 may be removed prior to phosphor formation as described below. Such removal may be performed by, e.g., chemical etching, laser lift off, mechanical grinding and/or chemical-mechanical polishing, or the like. In some embodiments, substrate 1410 is used as a template for growth of the active layers of the device, for example layers 1420, 1430, and 1440. In some embodiments, in use, substrate 1410 provides mechanical support but does not provide an electrical or optical function and may be removed. In some embodiments, removal of substrate 1410 during the formation process for the white die includes removal of all or a portion of substrate 1410 that does not provide electrical functionality (e.g., does not contribute to the emission or detection of light).

FIG. 16 shows structure 1600 which is similar to the structure shown in FIG. 15, but with substrate 1410 removed. In one embodiment, structure 1600 may be formed using a process similar to that described in relation to FIGS. 4A-4G, where substrate 1410 is removed between the steps associated with FIG. 4A and FIG. 4B. For example after LEEs 210 are formed on base 410, substrate 1410 is removed or partially removed, for example, using a laser lift-off process. After completion of the process, the resulting ACA white die is similar to that shown in FIG. 16. In another embodiment, base 410 is used to hold LEE 210 while a portion or all of substrate 1410 is mechanically and/or chemically removed. In another embodiment, a process similar to that described in relation to FIGS. 6A-6G may be used, where substrate 1410 is removed between the steps associated with FIG. 6B and FIG. 6D. In one embodiment, the structure shown in FIG. 6B is mounted on base 610, and substrate 1410 is removed before or after singulation. In one embodiment, substrate 1410 is removed after singulation and expansion at the point in the process shown in FIG. 6D. As discussed herein, singulation may be accomplished by a variety of means, for example including laser lift-off, mechanical polishing and/or lapping, exfoliation and chemical etching.

Figure 18:
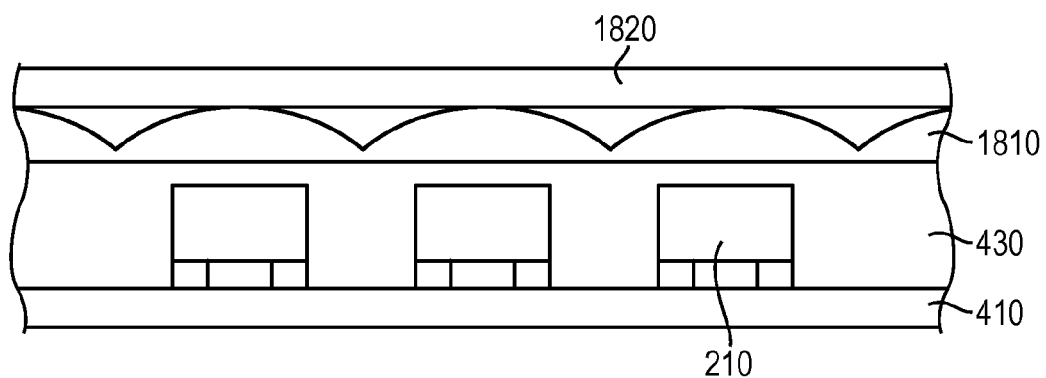
FIG. 18 is a cross-sectional schematic of an intermediate structure formed during the fabrication of the coated die of FIG. 17A in accordance with various embodiments of the invention.

In one embodiment, structures like those shown in FIGS. 17A-17C may be formed by adding an array of optical elements to the mold during the fabrication process. FIG. 18 shows an optical array 1810 of optical elements between mold top 1820 and phosphor 230. In some embodiments, optical element 1710 may be a Fresnel optic or a refractive optic. In some embodiments, optical element 1710 may initially be part of an array of optical elements such as optical array 1810 as discussed herein, while in other embodiments, one or more optical elements 1710 may be positioned individually in the formation process. In one embodiment, optical array 1810 may be all or a portion of the mold top 1820.

In another embodiment, optical array 1810 may be joined to an ACA white die wafer after fabrication of ACA white die wafer, for example between the steps associated with FIG. 4E and FIG. 4F or between the steps associated with FIGS. 6E and 6F. In one embodiment, phosphor 430 may be partially cured, mated to optical array 1810, and then be subjected to additional curing to physically attach optical array 1810 to the phosphor. In one embodiment, an adhesive may be used to attach optical array 1810 to the white die wafer. Examples of adhesives include optical adhesives, spray adhesives, adhesive tape, polyurethane, the same material used as the binder for phosphor 230, or the like. The method of attachment of optical array 1810 to the white die wafer is not a limitation of the present invention. In some embodiments, the adhesive has an index of refraction that provides index matching between phosphor 230 and optical array 1810. In some embodiments, after attachment of optical array 1810 to the white die wafer, singulation takes place to separate the structure into smaller elements, each containing at least one LEE 210 and one optical element 1710.

As shown, optical array 1810 includes or consists essentially of one or more optical elements 1710, which in FIGS. 17A-17C and FIG. 18 are aligned or substantially aligned with white dies 200. Optical array 1810 typically features an array of optical elements 1710; in some embodiments, one optical element 1710 is associated with each white die 200, while in other embodiments multiple white dies 200 are associated with one optical element 1710, or multiple optical elements 1710 are associated with a single white die 200, or no engineered optical element is associated with any white die 200, for example all or portions of optical array 1810 may be a plate with a flat or roughened surface. In one embodiment, optical array 1810 includes elements or features to scatter, diffuse and/or spread out light generated by white dies 200.

Optical array 1810 may be substantially optically transparent or translucent. For example, optical array 1810 may exhibit a transmittance greater than 80% for optical wavelengths ranging between approximately 400 nm and approximately 600 nm. In one embodiment, optical array 1810 includes or consists essentially of a material that is transparent to a wavelength of light emitted by white dies 200. Optical array 1810 may be substantially flexible or rigid. In some embodiments, optical array 1810 includes multiple materials and/or layers. Optical elements 1710 may be formed in or on optical array 1810. Optical array 1810 may include or consist essentially of, for example, acrylic, polycarbonate, polyethylene naphthalate (PEN), polyethylene terephthalate (PET), polycarbonate, polyethersulfone, polyester, polyimide, polyurethane, silicone, glass, or the like. Optical elements 1710 may be formed by etching, polishing, grinding, machining, molding, embossing, extruding, casting, or the like. The method of formation of optical elements 1710 is not a limitation of embodiments of the present invention.

Optical elements 1710 associated with optical array 1810 may all be the same or may be different from each other. Optical elements 1710 may include or consist essentially of, e.g., a refractive optic, a diffractive optic, a total internal reflection (TIR) optic, a Fresnel optic, or the like, or combinations of different types of optical elements. Optical elements 1710 may be shaped or engineered to achieve a specific light distribution pattern from the array of light emitters, phosphors and optical elements.

As used herein, "alignment" and "aligned" may mean that the center of one structure, for example a white die 200, is aligned with the center of another structure, for example an optical element 1710.

Figure 19A:
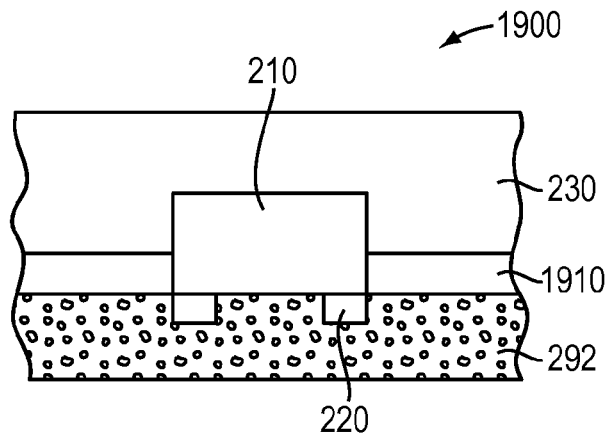
FIG. 19A is a cross-sectional schematic of a coated die in accordance with various embodiments of the invention.
Figure 19B:
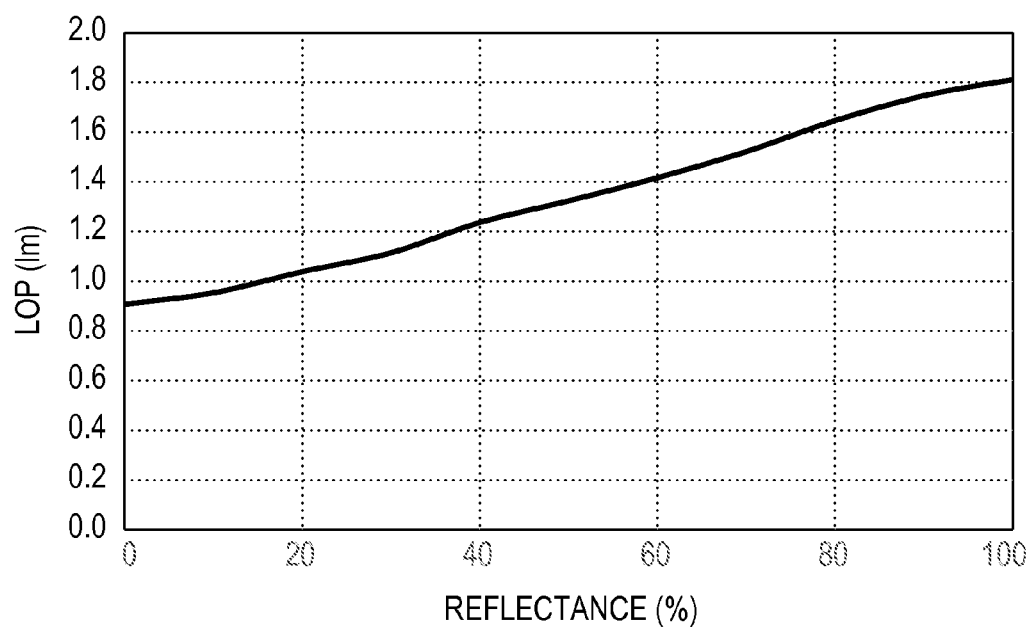
FIG. 19B is a graph showing light output power as a function of reflectance, in accordance with various embodiments of the invention.

In one embodiment of the present invention, a reflecting layer is formed between all or a portion of the region between phosphor 230 and ACA 292, for example to reflect light back in a direction away from the ACA. In some embodiments, ACA may partially absorb a portion of the light emitted by the white die, and it may be advantageous to reflect the light rather than allowing it to be absorbed by the ACA. FIG. 19A shows a white die 1900 that is similar to that shown in FIG. 2A, with the inclusion of a reflecting layer 1910. Reflecting layer 1910 may be reflective to a wavelength of light emitted by phosphor 230 and/or LEE 210. In some embodiments, reflecting layer 1910 has a reflectivity greater than 40% to a wavelength of light emitted by phosphor 230 and/or LEE 210. In some embodiments, reflecting layer 1910 has a reflectivity greater than 60% to a wavelength of light emitted by phosphor 230 and/or LEE 210. In some embodiments, reflecting layer 1910 has a reflectivity greater than 80% to a wavelength of light emitted by phosphor 230 and/or LEE 210. FIG. 19B shows a simulation of a white die in which the reflectance of reflecting layer 1910 is varied from 0 to 100%. As may be seen, in some embodiments increasing the reflectance results in a substantial increase in light output power (LOP). For this example, if reflecting layer 1910 has almost no reflectivity, the light output power is about 0.9 lm, while if reflecting layer 1910 has about 100% reflectivity, the light output power is about 1.8 lm, which is an increase by a factor of about two.

Figure 20A:
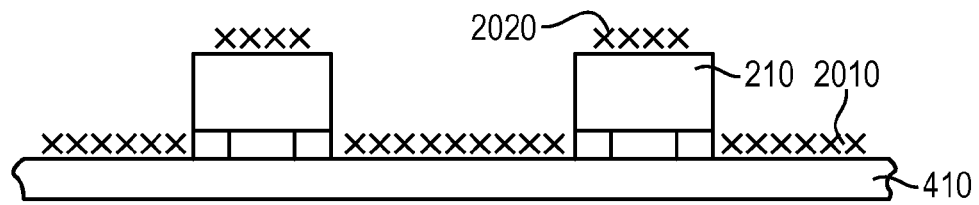
FIGS. 20A-20C are cross-sectional schematics depicting a process utilized to fabricate structures in accordance with various embodiments of the invention.
Figure 20B:
Figure 20C:
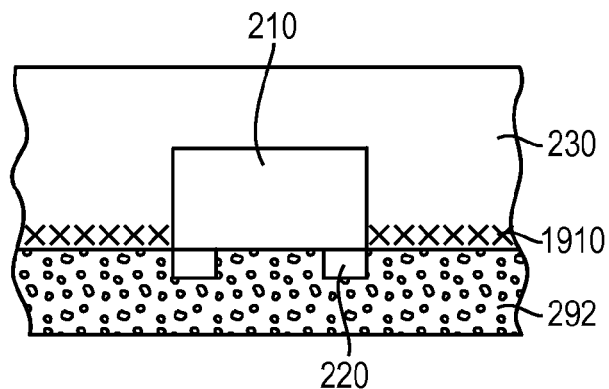

There are a number of ways in which a reflecting layer may be formed. In one embodiment, a powder, particulate or beads of a material that is reflective to a wavelength of light emitted by phosphor 230 and/or LEE 210 is dispersed over mold substrate 410 after positioning of LEEs 210 on mold substrate 410, as shown in FIG. 20A. As shown in FIG. 20A, this may result in a portion 2020 of the powder on top of LEEs 210 and a portion 2010 of the powder directly on mold substrate 410. In some embodiments, powder 2010 may adhere to mold substrate 410 but the portion 2020 may not adhere well to the top of LEE 210, and the structure shown in FIG. 20A may be tilted, inverted, exposed to a jet of gas, shaken, or otherwise processed to remove powder 2020 on top of LEEs 210. The white die formation process may then be applied to the structure shown in FIG. 20B, resulting in white die 2000 where reflecting layer 1910 is composed of the reflecting powder. In some embodiments, the reflective powder may include at least one of polystyrene, polyester, glass, barium titanate glass, gold, silver, aluminum, mica, silica, PMMA, fumed silica, fumed alumina, $TiO_2$ or the like; however, the composition of the reflective powder is not a limitation of the present invention.

In some embodiments, powder 2010, 2020 is formed of particles that have a dimension in the range of about 0.01 µm to about 100 µm, or preferably in the range of about 1 µm to about 50 µm. In some embodiments, the layer of phosphor into which is adhered, embedded or infused powder 2010, 2020 has a thickness in the range of about 0.1 µm to about 50 µm. In some embodiments, it is advantageous for the thickness of the layer of phosphor into which powder 2010, 2020 is adhered, embedded or infused to be less than the thickness of LEE 210, such that it does not occlude the light emitted from the side of LEE 210. In some embodiments, the phosphor layer into which powder 2010, 2020 is adhered, embedded or infused has a thickness less than about 50% of the thickness of LEE 210, or less than about 25% of the thickness of LEE 210, or less than about 10% of the thickness of LEE 210.

In some embodiments, material 2010, 2020 includes or consists essentially of reflective or partially reflective beads, for example having a spherical or substantially spherical shape. In some embodiments, the particles or beads may be solid, while in other embodiments the particles or beads may be hollow. In some embodiments, beads 2010, 2020 may have a diameter in the range of about 0.1 μm to about 150 μm, while in other embodiments they may have a diameter in the range of about 1 μm to about 75 μm. In some embodiments, the beads may be white and have a reflectivity to a wavelength of light emitted by LEE 210 and/or phosphor 230 greater than about 70%. In some embodiments, the beads or particles may have a refractive index of at least 1.35, or at least 1.5, or at least 1.9. In some embodiments, the beads or particles have a refractive index that is at least 10% larger than the refractive index of the phosphor or binder or at least 25% larger than the refractive index of the phosphor or binder. In some embodiments, the particles may include or consist essentially of more than one material. For example, in some embodiments, the particles may include or consist essentially of a core, which may be solid or hollow, and one or more coatings. For example in some embodiments, the particle may include or consist of a glass or polymer bead or sphere that is coated with aluminum, gold, silver or the like. In some embodiments, the particle or sphere may be coated with multiple coatings, for example to form a Bragg mirror. In one embodiment, the beads may act as retro-reflectors that substantially redirect the light back in the direction from which it was incident on the bead.

Figure 21A:
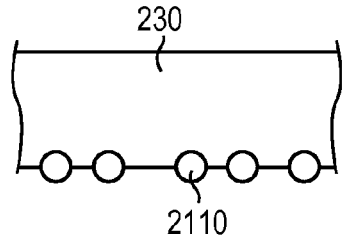
FIGS. 21A and 21B are cross-sectional schematics of structures incorporating reflective particles in accordance with various embodiments of the invention.
Figure 21B:
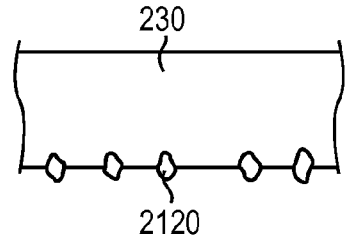

In some embodiments, a portion of the beads or particles may protrude from phosphor 230, as shown in FIGS. 21A and 21B. In some embodiments, particles 2110 or 2120 may protrude or extend from phosphor 230. In some embodiments, at least 5% of the particle may protrude from phosphor 230. In some embodiments, at least 20% of the particle may protrude from phosphor 230. In some embodiments, at least 40% of the particle may protrude from phosphor 230. In some embodiments, the protruding portion of the particle may be covered or partially covered by a relatively thin layer of phosphor or binder material. In some embodiments, the protruding portion of the particle may be in contact with ACA 292.

Figure 22A:
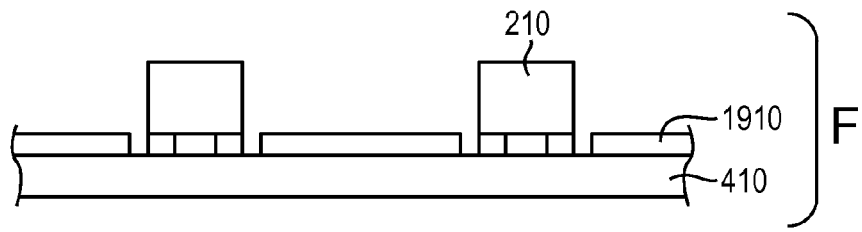
FIGS. 22A, 22B, 23A, 23B, 23D, 24A, 24B, and 25A-25E are cross-sectional schematics depicting a process utilized to fabricate structures in accordance with various embodiments of the invention.
Figure 22B:
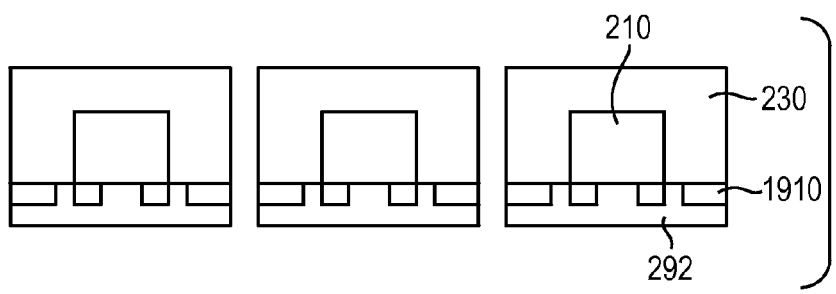

In one embodiment, the reflecting layer is formed using a reflective film. For example, a reflecting film 1910, similar to a mold release film, may be positioned over a portion of mold substrate 410, as shown in FIG. 22A. After formation and curing of phosphor 230 and singulation, reflecting film 4510 adheres to and/or is embedded into cured phosphor 230 of the white die instead of acting to reduce adhesion between cured phosphor 230 and mold substrate 410, as is the case with the mold release film, as shown in FIG. 22B. As discussed herein, the film may, by itself or in combination with other approaches, be used to control die and contact relief. In some embodiments, reflective film 1910 includes or consists essentially of metal films or foils such as Cr, Al, Au, Ag, Cu, Ti, or the like. In some embodiments, reflective layer 1910 may include or consist essentially of more than one layer. In some embodiments, reflective layer 1910 may include or consist essentially of multiple layers of metal. In one embodiment, reflective film 1910 may have a thickness in the range of about 0.25 μm to about 50 μm, or preferably in the range of about 5 μm to about 35 μm. In some embodiments, the thickness of reflective film 1910 is chosen such that it is not thick enough to occlude a substantial portion of light emitted from the side(s) of LEE 210. In one embodiment, reflective film 1910 is a foil that has been patterned with holes corresponding to the position of LEEs 210 on mold substrate 410. In some embodiments, the thickness of the reflective film or particles is advantageously less than the thickness of LEE 210, for example less than about 50% of the thickness of LEE 210, or less than about 25% of the thickness of LEE 210, or less than about 10% of the thickness of LEE 210.

In one embodiment, reflective layer 1910 may be deposited on mold substrate 410 and patterned to permit positioning of LEEs 210 directly on mold substrate 410. In one embodiment, reflective layer 1910 may be applied selectively to mold substrate 410, for example through a shadow mask or selectively applied by evaporation, sputtering, spraying, or the like. In one embodiment, a reflecting layer may be formed by printing, for example screen, stencil, ink jet, gravure, flexo printing or the like. In one embodiment, reflective layer 1910 may be composed of more than one layer of materials, for example a carrier and a reflective layer. For example, in some embodiments, reflecting layer 1910 may include or consist essentially of a support substrate that includes or consists essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper and the reflecting film may include or consist essentially of aluminum, gold, silver, copper, ink or the like.

Figure 23A:
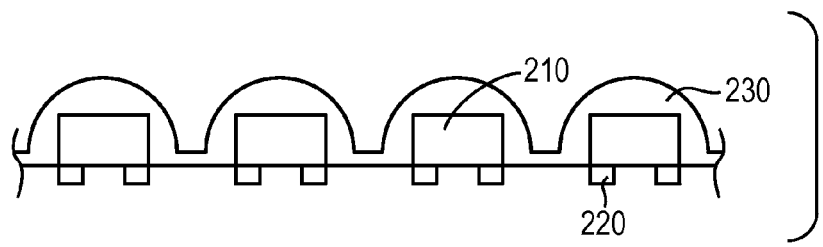
Figure 23B:
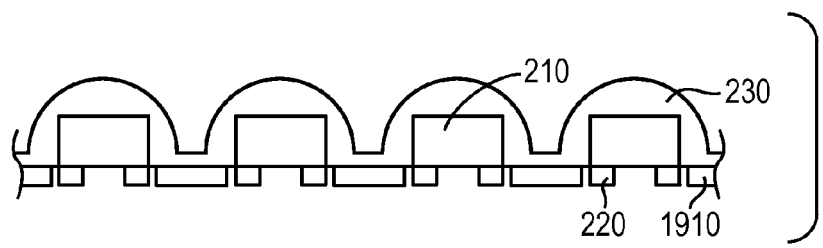
Figure 23C:
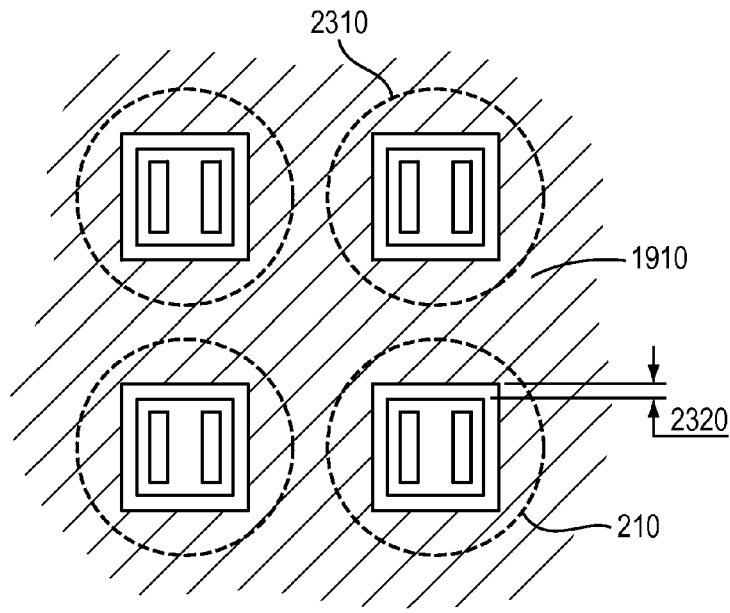
FIG. 23C is a plan-view schematic of the structure depicted in FIG. 23B.
Figure 23D:
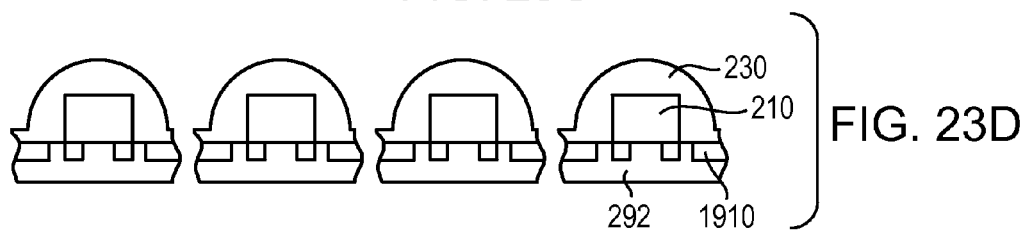

In another embodiment, reflective layer 1910 may be applied to the white wafer after it is formed. For example, in some embodiments, reflective layer 1910 may be formed by deposition of a reflecting layer on the bottom of the white wafer, where, in some embodiments, the reflective material is formed such that it does not come in electrical contact with any portion of the electrical contacts of LEEs 210. In some embodiments, this may be done by deposition of a metal layer, for example, Cr, Al, Au, Ag, Cu, Ti or the like, for example by evaporation, physical vapor deposition, sputtering, chemical vapor deposition, plating or the like. In some embodiments, it may be accomplished by lamination of a patterned foil. FIG. 23A shows an example of one embodiment of a white wafer including or consisting essentially of LEEs 210 and phosphor 230. In this example, phosphor 230 has a dome-like shape; however, this is not a limitation of the present invention, and in other embodiments phosphor 230 may have any shape. FIG. 23B shows the structure of FIG. 23A at a later stage of manufacture, where reflecting layer 1910 has been formed over a portion of phosphor 230. In the example shown in FIG. 23B, reflecting layer 1910 is formed over substantially all of the face of phosphor 230 containing contacts 220 of LEEs 210. FIG. 23C shows a plan view of the structure of FIG. 23B, from the side facing reflecting layer 1910. In this example, reflecting layer 1910 covers substantially all of the phosphor on this face, except for a region around each LEE 210. In FIG. 23C, reflecting layer 1910 is identified as the cross-hatched region and the edge of the dome of phosphor 230 is identified as 2310. In subsequent steps, ACA 292 is applied over reflecting layer 1910 and the resulting structure is singulated; FIG. 23D shows an example of the structure after formation of ACA 292 and singulation. In this example, reflecting layer 1910, ACA 292, and a portion of phosphor 230 are separated to form the individual ACA white dies.

A gap 2320 between LEE 210 and reflecting layer 1910 is shown in FIG. 23C as being the same or substantially the same around the entire periphery of LEE 210; however, this is not a limitation of the present invention, and in other embodiments the gap may vary. In some embodiments, the gap may have a value in the range of about 0 µm to about 300 µm, while in other embodiments the gap may have a value in the range of about 25 µm to about 100 µm; however, in some embodiments, the gap is preferably kept as small as possible to increase the amount of light reflected by reflecting layer 1910. In some embodiments, the gap may be negative, that is reflecting layer 1910 may cover a portion of LEE 210. As will be discussed herein, in some embodiments reflecting layer 1910 may cover all or a portion of contacts 220.

Figure 24A:
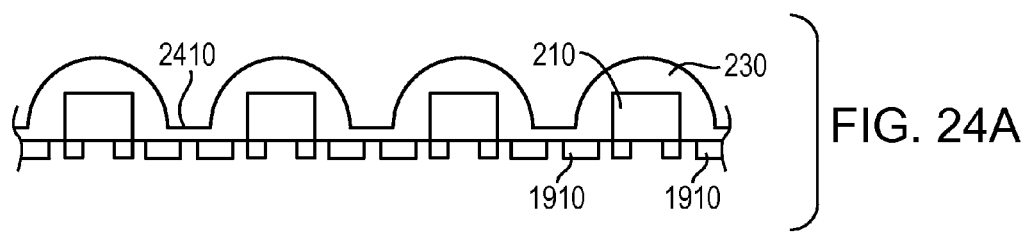
Figure 24B:
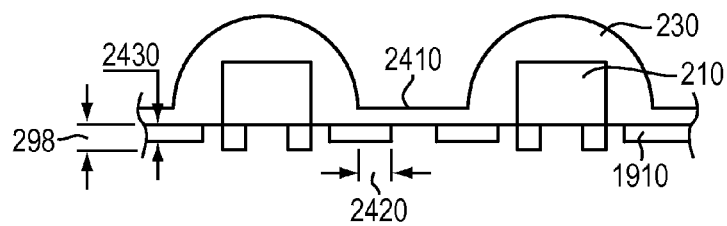

In some embodiments, it may be advantageous to form separate regions of reflecting layer 1910 before singulation of the white die wafer. For example, the singulation technique and process parameters may be relatively difficult to optimize for multiple sets of materials, for example in the case where reflecting layer 1910 includes or consists essentially of a metal and phosphor 230 includes or consists essentially of a polymer. FIG. 24A shows an example of a structure similar to that of FIG. 23B, with the exception that reflecting layer 1910 is absent from a region 2410 between ACA white dies, as shown in FIG. 24A, also known as the street region, where singulation of the white die wafer occurs. FIG. 24B shows an expanded view of the region between two adjacent white dies. In the example shown in FIG. 24B, reflecting layer 1910 extends into street region 2410 by an amount 2420. In some embodiments, the extension amount 2420 may be positive, as shown in FIG. 24B, where reflecting layer 1910 extends into street region 2410, while in other embodiments, extension amount 2420 may be negative, that is there is a gap between reflecting layer 1910 and street region 2410. In some embodiments, a positive extension 2420 may have a value in the range of about 0 to about 25% of the width of street region 2410; however, this is not a limitation of the present invention, and in other embodiments extension 2420 may have any value. In some embodiments a negative extension 2420 may have a value in the range of about 0 to about 25% of the width of the white die; however, this is not a limitation of the present invention, and in other embodiments extension 2420 may have any value. However, a negative extension 2420 will decrease the reflecting area, and in some embodiments, a negative extension 2420 is minimized or eliminated. In some embodiments, street region 2410 is advantageously minimized to increase the number of devices manufactured per unit area and to minimize cost. While the discussion in reference to FIGS. 23A-23D and 24A and 24B has been with respect to dome-shaped phosphor 230, this is not a limitation of the present invention, and in other embodiments phosphor 230 may have any shape.

While FIG. 24B shows reflecting layer 1910 having a thickness 2430 less than contact relief 298 this is not a limitation of the present invention and in other embodiments reflecting layer 1910 may have a thickness 2340 greater than contact relief 298 or may have a thickness equal to contact relief 298. However, in some embodiments, contact relief 298 is advantageously larger than thickness 2340, in order to aid in making low-contact resistance, robust connection to contacts 220.

Figure 25A:
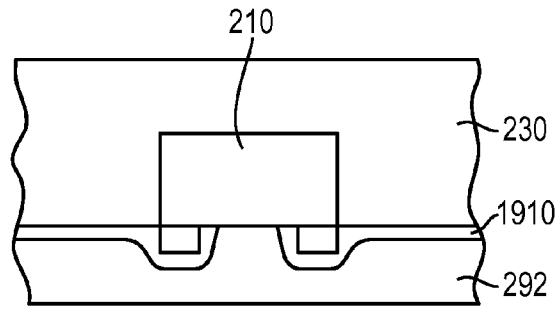
Figure 25B:
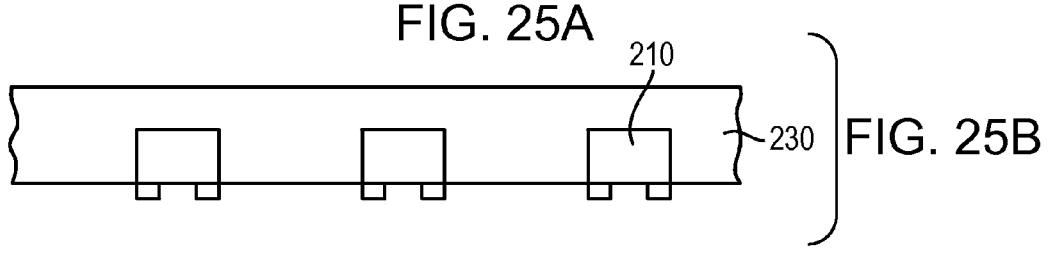
Figure 25C:
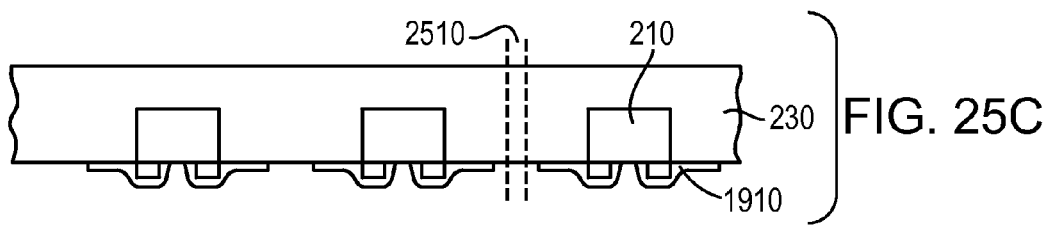

In some embodiments, all or a portion of contacts 220 may be covered by reflecting layer 1910. In such embodiments, it is preferable that reflecting layer 1910 is conductive, such that current may flow from contacts 220 through reflecting layer 1910 and ACA 292 to, for example, an underlying conductive trace or substrate. Examples of conductive reflecting materials may include, for example, Cr, Al, Au, Ag, Cu, Ti or the like, conductive inks such as silver ink, carbon ink, copper ink, or the like. FIG. 25A shows an example of an ACA white die in which contacts 220 are covered by reflecting layer 1910. While the structure of FIG. 25A shows contacts 220 being completely covered by reflecting layer 1910, this is not a limitation of the present invention, and in other embodiments only a portion of contacts 220 may be covered by reflecting layer 1910. FIG. 25B shows one embodiment of the structure of FIG. 25A at an early stage of manufacture. FIG. 25B shows a white wafer including or consisting essentially of LEEs 210 and phosphor 230. FIG. 25C shows the structure of FIG. 25B at a later stage of manufacture, where reflecting layer 1910 has been formed over portions of phosphor 230 and LEEs 210 such that contacts 220 of LEE 210 are covered by reflecting layer 1910. In some embodiments, reflecting layer 1910 may be formed over the entire surface of the white wafer containing contacts 220 and subsequently removing portions of reflecting layer 1910 to produce the structure of FIG. 25C. For example reflecting layer 1910 may be formed by physical vapor deposition, chemical vapor deposition, evaporation, sputtering, plating, lamination, spraying, printing, screen printing, or the like. This layer may then be patterned, for example by lithography, and portions removed, for example by etching, wet chemical etching, dry etching, RIE, ablation, or the like. In another embodiment, reflecting layer may be deposited selectively. For example, reflecting layer 1910 may be deposited through a physical or shadow mask using evaporation, sputtering or the like, or may be deposited using a selective deposition process that results in reflecting layer 1910 only forming in specific regions, or may be accomplished by lamination or formation of a patterned film or foil of reflecting layer 1910 on phosphor 230.

Figure 25D:
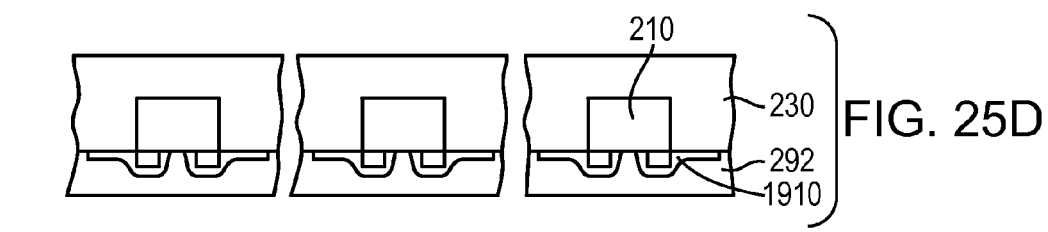

In the example shown in FIG. 25C, reflecting layer 1910 is not formed in the street or singulation region, identified as 2510; however, this is not a limitation of the present invention, and in other embodiments reflecting layer 1910 may be formed in street or singulation region 2510. In some embodiments, it may be advantageous to not form reflecting layer 1910 in the street or singulation region, as this may simplify the singulation process. As may be seen in FIG. 25C, the portions of reflecting layer 1910 that are coupled to each contact 220 are not electrically coupled to each other, to avoid shorting LEE 210. FIG. 25D shows the structure of FIG. 25C at a later stage of manufacture, after formation of ACA 292 and singulation, resulting in the structure of FIG. 25A.

Figure 25E:
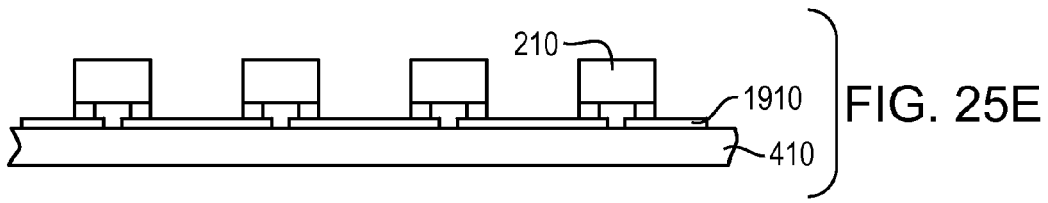
Figure 25F:
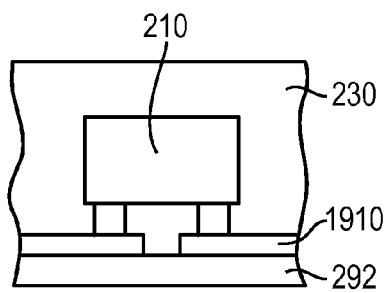
FIGS. 25F, 25G, and 26A-26D are cross-sectional schematics of electronic devices in accordance with various embodiments of the invention.
Figure 25G:
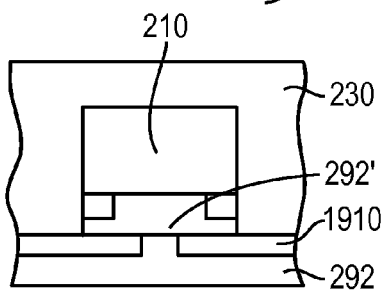

In some embodiments, a patterned conductive film or foil of reflecting material 1910 may be formed on mold substrate 410 or another base, in a fashion similar to that shown in FIG. 22A, but where the conductive foil is under all or a portion of contacts 220, as shown in FIG. 25E such that current flows to LEE 210 through conductive foil 1910 and contacts 220. Portions of the conductive foil may be electrically coupled to contacts 220, for example using solder, low temperature solder, conductive epoxy, ACA, ACF, physical mating or the like. FIG. 25F shows an example of the structure of FIG. 25E at a later stage of manufacture, after formation of phosphor 230 and ACA 292. FIG. 25G shows an example of an embodiment where contacts 220 are electrically coupled to conductive foil 1910 using ACA 292'. In some embodiments, the conductive film may include or consist essentially of aluminum, gold, silver, titanium, copper, or the like. In one embodiment, conductive film 1910 includes or consists essentially of aluminum or copper and has a thickness in the range of about 1 µm to about 250 µm, or more preferably in the range of about 5 µm to about 40 µm.

In some embodiments, reflective layer 1910 may be insulating or relatively insulating. For example, reflective layer 1910 may include a dielectric mirror or Bragg reflector, composed of alternating layers of materials with different indices of refraction. Examples of such materials include silicon dioxide, silicon nitride, or mixtures of these materials.

In some embodiments, reflective layer 1910 may be a specular reflector, or it may be a diffuse reflector. For example, a reflective layer 1910 made from powder may provide a more diffuse reflector while a reflective layer 1910 made from a metal foil or film may provide a more specular reflector. Reflective layer 1910 may also include or consist essentially of a diffuse reflective film, such as a white film, for example white PET, other white plastic films, polyester, polypropylene, White97 manufactured by WhiteOptics LLC, or MCPET manufactured by Furukawa. In some embodiments, a white ink or paint may be applied selectively to the back of the white wafer to form reflective layer 1910. In some embodiments, reflective layer 1910 may include or consist essentially of a polymer or plastic, such as polyethylene, silicone or epoxy or the like, with a relatively high reflectivity, for example a white diffuse reflector such as Dow Corning MS-2002. In some embodiments, the silicone or epoxy may have a reflectivity greater than about 95% or greater than about 95% or greater than about 97%. In some embodiments, reflective layer 1910 may include or consist essentially of a white epoxy. In some embodiments, reflective material 1910 may include or consist essentially of a thin layer of reflective epoxy or silicone formed over mold substrate 410, as shown in FIG. 22A, over which is subsequently formed phosphor 230.

In some embodiments, ACA 292 may be reflective to a wavelength of light emitted by LEE 210 and/or phosphor 230. In some embodiments, ACA 292 may have a reflectivity of greater than 50% or greater than 70% or greater than 85% to a wavelength of light emitted by LEE 210 and/or phosphor 230.

In another embodiment, the use of materials similar to those described herein with respect to reflecting materials may be used for other purposes, for example to modify other characteristics, for example adhesion of cured phosphor 230 to ACA 292. In some embodiments, modification of other properties may be combined with reflectivity; however, this is not a limitation of the present invention, and in other embodiments it may be a material that is not substantially reflective. For example, a material formed on mold substrate 410 before formation of uncured phosphor 420 (FIG. 4B) may result in a layer at or near the phosphor/mold substrate interface that reduces the adhesion of cured phosphor 230 to mold substrate 410. In some embodiments, this may be a reflective material; however, this is not a limitation of the present invention, and in other embodiments it may be a material that is not substantially reflective. In some embodiments, this may be a powder, as discussed herein, while in other embodiments this may be a film. In some embodiments, this may act like a mold release material or film, discussed herein, except that in some embodiments the material is incorporated into phosphor cured phosphor.

In some embodiments, reflective layer 1910 may include or consist essentially of more than one material or layer, where each layer serves a different purpose. For example, in one embodiment, reflective layer 1910 may include or consist essentially of a first reflective layer adjacent to white die 200, and a second adhesion layer, adjacent to the first reflective layer, to provide improved adhesion of the reflective layer to the underlying substrate or contacts.

As discussed herein, in some embodiments all or a portion of the surface of phosphor 230 may be roughened or textured, for example to reduce TIR and increase the light output or to increase adhesion between phosphor 230 and an adjacent material, for example to increase adhesion to ACA 292. In some embodiments, roughening or texturing may take place during the molding process. In some embodiments, all or a portion of the mold substrate surface in contact with phosphor 420 may be roughened or textured to impart such roughened or textured features to cured phosphor 230. In some embodiments, such roughening or texturing may be accomplished after molding, for example by ablation, laser ablation, chemical etching or chemical ablation, plasma exposure, plasma etching, imprinting, indenting or the like. The method of roughening or texturing is not a limitation of the present invention.

In one embodiment, the textured features may have a size in the range of about 0.1 µm to about 50 µm and more preferably in the range of about 0.5 µm to about 25 µm. In one embodiment, the texture may be hemispherical or pyramidal in shape; however, this is not a limitation of the present invention, and in other embodiments the texture may have any shape. In one embodiment, the texture includes or consists essentially of a regular or substantially regular pattern, while in other embodiments the texture includes or consists essentially of random or substantially random features. In some embodiments, the scale of the texture is advantageously less than about 10% of the height of LEE 210, or less than 5% of the height of LEE 210 or less than 2% of the height of LEE 210, in order to reduce occlusion or absorption of light emitted by LEE 210.

Figure 26A:
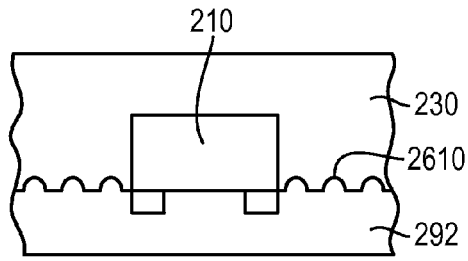
Figure 26B:
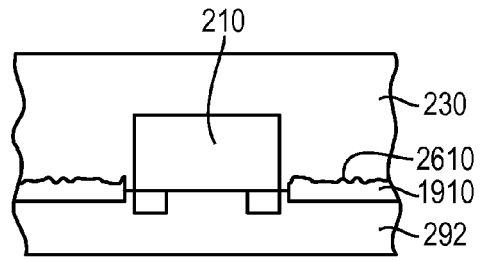
Figure 26C:
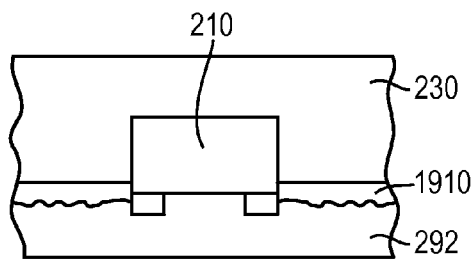
Figure 26D:
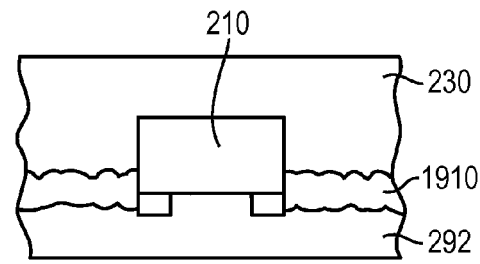

FIGS. 26A and 26B show two examples of embodiments incorporating textured phosphor adjacent to ACA 292. In FIG. 26A a texture 2610 has a regular periodic structure, while the embodiment shown in FIG. 26B has an irregular or substantially random structure. The structure of FIG. 26B also includes reflective layer 1910. While FIG. 26B shows the side of reflective layer 1910 opposite phosphor 230 as flat, this is not a limitation of the present invention and in other embodiments the side of reflective layer 1910 opposite phosphor 230 may not be flat, or reflective layer 1910 may be textured by conforming or substantially conforming to the textured surface of phosphor 230. For example, FIG. 26C shows an embodiment including a reflective layer 1910 with a textured surface adjacent to ACA 292, while FIG. 26D shows an embodiment including a reflective layer 1910 with textured surfaces adjacent to ACA 292 and phosphor 230. In some embodiments, all of the individual features making up the texture have the same or substantially the same shape, while in other embodiments the individual features making up the texture have different shapes. While the structures shown in FIGS. 26A and 26B show textured phosphor adjacent to substantially all of ACA 292, this is not a limitation of the present invention, and in other embodiments only a portion of the phosphor adjacent to ACA 292 may be textured.

In the case of the embodiment shown in FIG. 26A, the texture may be formed using a mold having a regular periodic structure formed in the mold that is then transferred to the phosphor. In some embodiments, each individual feature may have substantially the same shape, but the features do not form a periodic array. In some embodiments, such a structure may be formed by molding using a mold having those characteristics, or by formation of particles or beads on mold substrate 410, where each particle or bead has substantially the same shape, but the position of the beads does not form a regular periodic array, and then molding over the beads.

In the case of the embodiment shown in FIG. 26B, the texture may be formed using a mold having an irregular or substantially random structure of different shapes formed in the mold that is then transferred to the phosphor. In some embodiments, such a structure may be formed by formation of particles or beads on mold substrate 410, where each particle or bead does not have the same shape, for example a powder, flake, or fleck and where the position of the particles does not form a regular periodic array.

In some embodiments, a texture may be imparted to cured or partially cured phosphor by indentation or impression of a textured plate onto the phosphor.

Figure 27A:
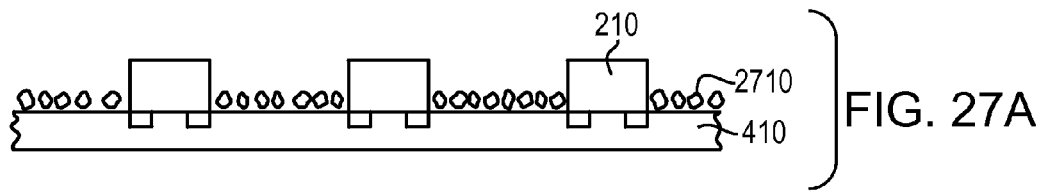
FIGS. 27A-27C are cross-sectional schematics depicting a process utilized to fabricate structures in accordance with various embodiments of the invention.
Figure 27B:
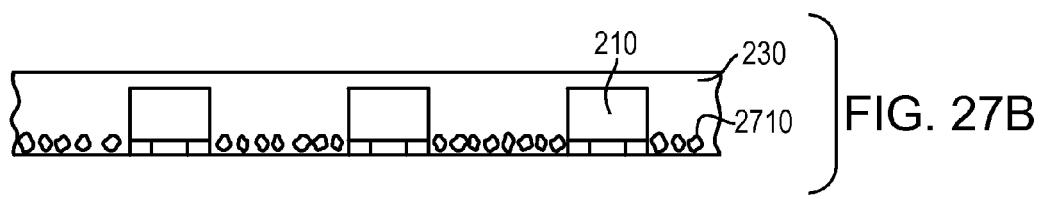
Figure 27C:
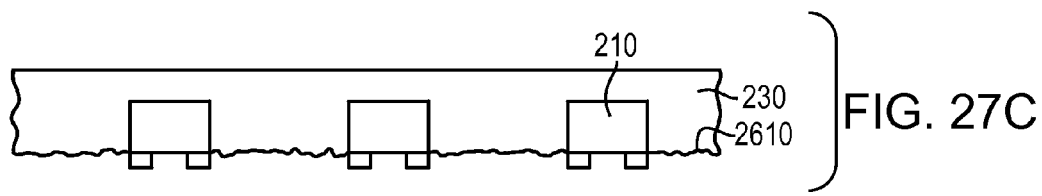

In some embodiments, a material may be formed on mold substrate 410 before or as part of the formation of uncured phosphor 420, and after curing of the phosphor, all or portions of this material may be removed, leaving voids, pits or indentations in portions of cured phosphor 230. FIGS. 27A-27C show an example of one embodiment of a process to produce texture by removal of material after curing of the phosphor. FIG. 27A shows mold substrate 410 over which has been formed LEEs 210 and particles 2710. FIG. 27B shows the structure of FIG. 27A at a later stage of manufacture. In FIG. 27B uncured phosphor 420 has been formed over mold substrate 410, LEEs 210, and particles 2710 and cured and mold substrate 410 has been removed, leaving a structure in which particles 2710 are embedded or partially embedded in phosphor 230. FIG. 27C shows the structure of FIG. 27B at a later stage of manufacture. In FIG. 27C all or a portion of particles 2710 have been removed from cured phosphor 230, leaving texture 2610. In some embodiments, particles 2710 may be removed by etching or dissolving in a solution that does not or that does not substantially affect phosphor 230 and LEEs 210. For example, in one embodiment particles 2710 may include or consist essentially of one or more water-soluble materials such as polyvinyl alcohol (PVA), ammonium chloride, sodium chloride, flour, corn starch, sucrose, or the like. In one embodiment, particles 2710 may include or consist essentially of one or more alcohol-soluble materials such as sodium chloride, ammonium chloride, camphor, castor oil, lithium chloride, lithium iodide, or the like. In one embodiment, particles 2710 may include or consist essentially of a metal and be removed by etching in a suitable wet or dry etchant. For example, in one embodiment particles 2710 may include or consist essentially of aluminum and may be removed by etching in hydrochloric acid. The composition of particles 2710 and the techniques for removing them from phosphor 230 are not a limitation of the present invention.

In some embodiments, phosphor 230 may be textured by etching or removal of portions of the phosphor. In one embodiment, phosphor 230 may be free etched, that is treated without a mask, while in other embodiments a mask may be used as part of the texturing process. Silicone material may be etched using a variety of techniques, for example using dimethylacetamide based chemicals or other organic solvents, for example Dynasolve manufactured by Dynaloy. In some embodiments, the phosphor may be etched using a dry etch or RIE type etching, for example using an oxygen plasma. In some embodiments, the phosphor may be masked prior to etching, to promote formation of a particular scale of texture. As discussed herein, such texture may be regular or irregular. Formation of texture may be accomplished, for example by patterning and etching, for example using lithography combined with a mask. Mask materials may include photoresist, metals or other suitable materials. In some embodiments, formation may be accomplished by etching through a physical mask or stencil. In some embodiments, a mask may be formed by agglomeration, for example by formation of a relatively thin layer of metal on the phosphor, for example gold and then heating to induce coalescence in the metal to form a relatively random mask which may then be used for texture formation.

In some embodiments, all or a portion of the phosphor may be treated to increase adhesion of phosphor 230 to ACA 292. Such a treatment may include a wet chemical treatment, a plasma treatment, ozone exposure, oxygen plasma treatment or the like. For example, a chemical treatment may include a primer such as 1200 OS manufactured by Dow Corning.

As discussed herein, in some embodiments, a white die may include a portion of the phosphor having a texture, or a portion of the phosphor covered or overlaid with a reflecting layer, or both. In some embodiments, the reflecting layer itself may be textured, while in other embodiments the texture is separate from the reflecting layer.

While the discussion above has mainly focused on light-emitting devices that include a phosphor, this approach may be used as an approach to economically make light-emitting devices without the phosphor, where the material surrounding the LEE is a transparent material with no light-conversion material. In some embodiments, examples of such structures are similar to the structures shown in FIGS. 11A-11F, but where phosphor 230 in these figures is replaced by a transparent material. This may be referred to as a clear die or an ACA clear die. In this case, the transparent material may be referred to as a binder or an encapsulant. In this case the structure would appear similar to the examples discussed above, with the difference being that there is no light-conversion material present and the color of light emitted by such device is substantially the same as that emitted by the LEE. In some embodiments, other materials may be present in the binder, for example material to scatter the light. Any or all of the variations discussed with respect to this invention may be used to produce clear dies. This approach permits the low-cost manufacture of clear dies in very large volumes. In some embodiments, LEE 210 may include or consist essentially of an LED. In some embodiments, LEE 210 may emit light in any visible color range, for example, red, orange, yellow, green, amber, blue, etc., or in wavelengths outside of the visible range, e.g., infrared and ultraviolet. In some embodiments, additional elements could be formed as part of the ACA clear die, for example an optic, similar to the structures shown in FIGS. 17A-17C, or in some embodiments the clear die could be co-molded with an optical fiber. The optical fiber may be used for example, for out-coupling of light or monitoring of LEE 210 optical characteristics. Such optical fiber coupling may also be used with white dies or ACA white dies.

While the discussion above has mainly focused on light-emitting devices, embodiments of the present invention may also be used for devices that absorb light, for example detectors or photovoltaic devices. Structures, configurations and processes for producing ACA white die described herein may also be applied for fabrication of embodiments of the present invention incorporating one or more light-absorbing elements (LAE). For example, in one embodiment a LAE die may have a structure similar to that shown in FIGS. 2A-2G, 11A-11F, 12A-12C, 13A-13B and 17A-17C. In one embodiment the LAE may be configured to detect one or more wavelengths over a wide range of wavelength ranges, both within and outside the visible light spectrum. In various embodiments the LAE may be configured to detect UV light, IR light, x-rays, visible light or any portion of the electromagnetic spectrum for which a detector is available. In some embodiments, the LAE may include GaAs, InAs, AlAs, GaN, InN, AlN, GaP, InP, AlP, InGaP, InAlP, InGaAlP, ZnO, II-VI materials or the like or various combinations of two or more of these materials. The material from which the LAE is composed is not a limitation of the present invention.

In some embodiments, the LAE may be a Schottky detector, a p-n junction detector, a photoelectric detector, a photocell, a photoresistor, a photodiode, a phototransistor, a charge-coupled device, a CMOS imager or the like. The type of LAE and method by which the LAE operates are not limitations of the present invention.

In one embodiment, the binder is transparent to a wavelength of light to be detected by the LAE. In one embodiment, the binder surrounding the LAE may be partially absorbing and the absorption band of the binder may be used to select one or more wavelength ranges to be detected by the LAE from the range of incident wavelength ranges. For example the binder may effectively act as a low-pass filter, a high-pass filter, a bandpass filter or various combinations of these.

In some embodiments, the binder may further include other materials to enhance one or more performance aspects. For example, in one embodiment, the binder may include materials to absorb one or more wavelengths of light, to act as a filter. In one embodiment, the binder includes a wavelength-conversion material, similar to that described above. In one embodiment, this may be used to shift an incident wavelength to a different wavelength to be detected by the LAE. For example a phosphor may be added to the binder to shift one or more wavelengths of incident light (e.g., blue light) to one or more different wavelengths (e.g., yellow light) that impinge on the LAE. In this way one or a small number of the LAEs may be used in combination with a number of wavelength-conversion materials to produce a family of detectors spanning a wide wavelength range, without the need to have a relatively large number of different LAEs.

As discussed herein with respect to white dies, the binder may be shaped. In some embodiments the binder is shaped to increase the collection of light by the LAE. In some embodiments the binder is combined with one or more additives to the binder, for example a wavelength-conversion material.

In some embodiments a device may include more than one LAE. In one embodiment, the different LAEs may detect different wavelengths or different wavelength ranges, for example three different LAEs may detect red, green and blue. In some embodiments the combination may be used as a color sensor by evaluating the relative output signals from the three different LAEs.

In some embodiments the LAE is a photovoltaic device or solar cell, and is designed to produce power from incident radiation (typically, but not necessarily, in the visible range). Such a photovoltaic device may be made of a wide variety of materials. In some embodiments, the LAE may include GaAs, InAs, AlAs, GaN, InN, AlN, GaP, InP, AlP, InGaP, InAlP, InGaAlP, ZnO, II-VI materials or the like or various combinations of two or more of these materials. The material from which the LAE is made is not a limitation of the present invention. In some embodiments, the LAE is a single junction solar cell, while in other embodiments the LAE is a multi junction solar cell. As discussed herein with respect to light-emitting elements and detectors, photovoltaic devices produced using embodiments of the present invention may include in various embodiments a transparent binder, additives to the binder, wavelength-conversion materials, shaped binder, optics, multiple LAEs 5810 per device, and the like.

In some embodiments, a photovoltaic device made using this invention may additionally include one or more optics to increase collection or to act as concentrators. In one embodiment, the optical function for collection or concentration is carried out using a shaped binder.

In some embodiments, the binder may further include other materials to enhance one or more aspects of the performance of devices. For example, in one embodiment, the binder may include materials to absorb one or more wavelengths of light, to act as a filter. In one embodiment, the binder includes a wavelength-conversion material, similar to that described above with respect to white dies. In one embodiment, this may be used to shift an incident wavelength to a different wavelength to be absorbed by a solar cell. For example, a phosphor may be added to the binder to shift one or more wavelengths of incident light to one or more different wavelengths of light that impinge on the solar cell. In this way a larger portion of the solar spectrum may be usefully absorbed by the solar cell. In some embodiments, this may permit the use of a lower cost the solar cell, for example one with fewer junctions. In one embodiment, more than one different solar cell, each absorbing light in a different wavelength range, may be incorporated into one packaged device.

Embodiments of the present invention may be applied to devices that neither emit nor detect light, identified as electronic-only devices, where the purpose of application of this invention is in some embodiments reduction in cost. In various embodiments, a relatively large number of electronic devices, specifically chips or discrete devices or integrated circuits may be packaged in a polymer-based material (like the binder detailed above) using a high-volume, low-cost, base process. In some embodiments of this approach, the binder need not be transparent but may be translucent or opaque. As discussed herein with respect to light-emitting elements, detectors, and photovoltaic devices, electronic-only devices produced in accordance with embodiments of the present invention may include additives to the binder, shaped binder, multiple devices, and the like.

Figure 28A:
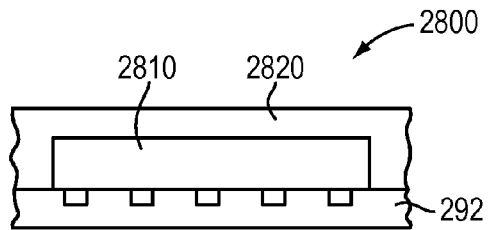
FIGS. 28A-28E are cross-sectional schematics of electronic devices in accordance with various embodiments of the invention.

In one embodiment, an electronic-only device of the present invention is a packaged electronic-only device, such as that shown in FIG. 28A, in which device 2800 includes electronic-only device 2810 and binder 2820. In some embodiments, electronic-only device 2810 may have a larger number of contacts than would a light emitter or a detector. For example electronic-only device 2810 may include more than ten contacts or more than 100 contacts or even larger number of contacts.

Figure 28B:
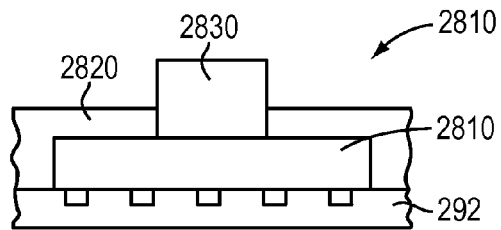
Figure 28C:
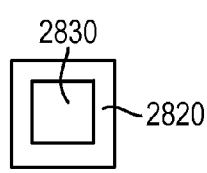
Figure 28D:
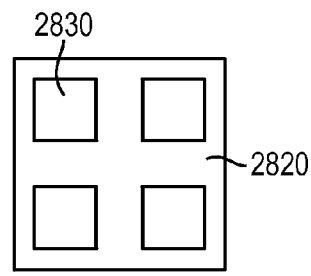

FIG. 28B shows another example, device 2801, incorporating a heat spreader 2830. A heat spreader, as utilized herein, is a volume of material with a relatively high thermal conductivity, in particular higher than that of binder 2820, which may be used to transfer heat from electronic-only device 2810 to ambient or to an additional thermal-management system. In some embodiments, heat spreader 2830 is a metal, for example Al, Cu, Au, Ag, Cr, or the like. In some embodiments, heat spreader 2830 is a ceramic, for example AlN, SiC, polycrystalline SiC, polycrystalline AlN, or the like. In some embodiments, heat spreader 2830 is a monolithic component, but this is not a limitation of the present invention, and in other embodiments heat spreader 2830 may comprise multiple discrete and separate portions, as shown in FIGS. 28C and 28D respectively. While heat spreader 2830 is shown as a square or rectangular in FIGS. 28C and 28D, this is not a limitation of the present invention, and in other embodiments heat spreader 2830 may have any shape or size. In one embodiment heat spreader 2830 is a heat pipe.

Figure 28E:
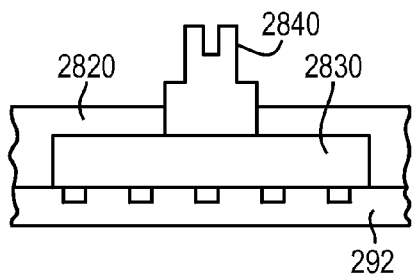

In another embodiment, a connector may be added to a device, for example an electronic-only device. In one embodiment, a connector 2840 is added on top of electronic-only device 2810 and held in place at least in part by the presence of binder 2820, as shown in FIG. 28E.

Figure 29:
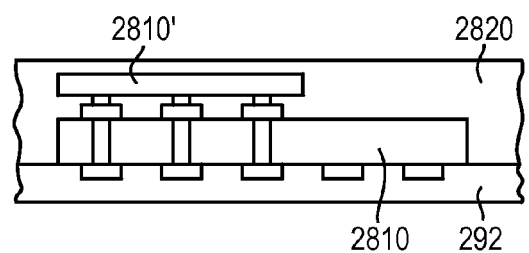
FIGS. 29 and 30 are cross-sectional schematics of packaged systems incorporating multiple devices in accordance with various embodiments of the invention.

In another embodiment, one or more devices may be stacked on top of each other, as shown in FIG. 29. FIG. 29 shows electronic-only device 2810' formed over electronic-only device 2810. FIG. 29 also shows optional vias through electronic-only device 2810, permitting electrical coupling between electronic-only devices 2810' and 2810. Other methods may be used to electrically couple devices, for example wire bonding, solder, conductive adhesives, etc. While FIG.

29 shows electronic-only device 2810 and 2810' having different sizes, that is not a limitation of the present invention, and in other embodiments electronic-only device 2810 and electronic-only device 2810' may have the same or substantially the same size.

Figure 30:
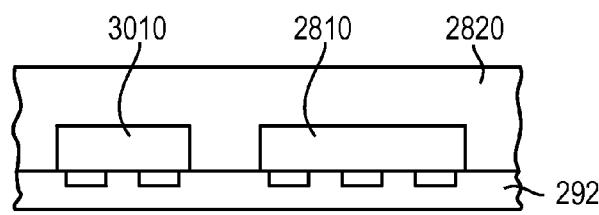

In another embodiment, electronic-only and other (for example light-detecting and/or light-emitting) devices may be packaged in the same binder, as shown in FIG. 30. FIG. 30 shows electronic-only device 2810 adjacent to light-detection device 3010. This approach may be used to provide some additional capability, for example signal conditioning, communications, memory or the like. In one embodiment, electronic-only device 2810 and light-detection device 3010 communicate through each of their respective contacts by way of connections on the circuit board to which they are ultimately mounted. In one embodiment, internal connection is used, for example similar to the vias shown in FIG. 29 or wire bonds, etc. In some embodiments, all or portions of binder 2820 may be transparent to a wavelength of light absorbed or emitted by light detecting or light-emitting device 3010.

While the discussion herein mainly focuses on down-conversion, that is the use of a wavelength-conversion material or phosphor to shift a short wavelength to a longer wavelength, that is not a limitation of the present invention, and in other embodiments up-conversion or a combination of up-conversion and down-conversion may be used.

Other embodiments of this invention may have additional or fewer steps or components or may be modified or carried out in a different order. In general in the above discussion the arrays of light emitters, wells, optics and the like have been shown as square or rectangular arrays; however, this is not a limitation of the present invention and in other embodiments these elements are formed in other types of arrays, for example hexagonal, triangular or any arbitrary array. In some embodiments, these elements are grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An electronic device comprising:
a solid shaped volume of a polymeric binder;
suspended within the binder, a semiconductor die having a first face, a second face opposite the first face, and at least one sidewall spanning the first and second faces, the semiconductor die being a bare-die light-emitting element comprising a plurality of active semiconductor layers that cooperatively emit light;
disposed on the first face of the semiconductor die, at least two spaced-apart contacts each having a terminal end not covered by the polymeric binder, the contacts each contacting a different active semiconductor layer of the semiconductor die; and
disposed over a portion of the polymeric binder and in electrical contact with the terminal ends of the contacts, an anisotropic conductive adhesive (ACA),
wherein (i) at least a portion of the polymeric binder is transparent to a wavelength of light emitted by the bare-die light-emitting element and (ii) the polymeric binder contains therein a wavelength-conversion material for absorption of at least a portion of light emitted from the bare-die light-emitting element and emission of converted light having a different wavelength, converted light and unconverted light emitted by the bare-die light-emitting element combining to form mixed light.

2. The electronic device of claim 1, wherein the ACA comprises an anisotropic conductive film.

3. The electronic device of claim 1, wherein at least a portion of the ACA opposite the contacts is free and available for electrical connection.

4. The electronic device of claim 1, wherein the polymeric binder and semiconductor die collectively define a rectangular solid having approximately 90° corners between adjacent faces thereof.

5. The electronic device of claim 1, wherein at least portions of the contacts protrude from the polymeric binder.

6. The electronic device of claim 1, wherein only a portion of each said sidewall protrudes from the polymeric binder, a portion of each said sidewall being covered with the polymeric binder.

7. The electronic device of claim 1, wherein the polymeric binder comprises at least one of—silicone or epoxy.

8. The electronic device of claim 1, further comprising one or more additional semiconductor dies suspended within the polymeric binder.

9. The electronic device of claim 1, wherein the wavelength-conversion material comprises at least one of a phosphor or quantum dots.

10. The electronic device of claim 1, wherein the light-emitting element comprises a semiconductor material comprising at least one of GaAs, AlAs, InAs, GaP, AlP, InP, ZnO, CdSe, CdTe, ZnTe, GaN, AlN, InN, silicon, or an alloy or mixture thereof.

11. The electronic device of claim 1, wherein the mixed light is substantially white light.

12. The electronic device of claim 11, wherein the substantially white light has a correlated color temperature in the range of 2000 K to 10,000 K.

13. The electronic device of claim 1, wherein the polymeric binder has a thickness between 5 μm and 2000 μm.

14. The electronic device of claim 13, wherein a dimension of the polymeric binder perpendicular to the thickness is between 25 μm and 50 mm.

15. The electronic device of claim 1, further comprising an optical element positioned to receive light from the semiconductor die.

16. The electronic device of claim 1, further comprising a reflecting layer over or within at least a portion of the polymeric binder.

17. The electronic device of claim 16, wherein the reflecting layer comprises at least one of (i) a reflecting film or (ii) a plurality of particles.

18. The electronic device of claim 1, wherein the reflecting layer has a reflectivity of at least 40% to a wavelength of light emitted by the wavelength-conversion material within the polymeric binder.

19. The electronic device of claim 1, wherein the polymeric binder comprises a plurality of discrete regions, at least one of which comprises the polymeric binder without wavelength-conversion material therein.

20. The electronic device of claim 1, wherein the active semiconductor layers of the semiconductor die are not disposed on a semiconductor substrate.

21. The electronic device of claim 1, wherein the polymeric binder coats the first face of the semiconductor die, the at least one sidewall of the semiconductor die, and at least a portion of the second face of the semiconductor die.

22. The electronic device of claim 1, wherein the terminal ends of the at least two contacts are in physical contact with the ACA.

23. The electronic device of claim 1, wherein at least a portion of the ACA is not activated to enable electrical conduction through a thickness thereof to the at least two contacts.

24. The electronic device of claim 1, further comprising a substrate having a plurality of conductive elements disposed thereon, wherein (i) at least two said contacts on the first face of the semiconductor die are each electrically coupled to a different conductive element on the substrate via the ACA and (ii) the at least two said contacts are electrically insulated from each other through the ACA.

* * * * *